United States Patent [19]

Ueki et al.

[11] Patent Number: 4,803,947
[45] Date of Patent: Feb. 14, 1989

[54] APPARATUS FOR FORMING DEPOSITED FILM

[75] Inventors: Masao Ueki, Chiba; Masaaki Hirooka, Toride; Junichi Hanna; Isamu Shimizu, both of Yokohama, all of Japan

[73] Assignee: Canon Kabushiki Kaisha, Tokyo, Japan

[21] Appl. No.: 3,053

[22] Filed: Jan. 13, 1987

[30] Foreign Application Priority Data

Jan. 15, 1986 [JP] Japan .................................. 61-5952
Jan. 15, 1986 [JP] Japan .................................. 61-5953
Jan. 15, 1986 [JP] Japan .................................. 61-5954

[51] Int. Cl.$^4$ ............................................. C23C 16/00
[52] U.S. Cl. ..................................... 418/719; 118/118; 156/345
[58] Field of Search ................ 118/719, 118; 156/345

[56] References Cited

U.S. PATENT DOCUMENTS

| | | | |
|---|---|---|---|
| 3,598,082 | 8/1971 | Rice | 118/719 |
| 4,436,770 | 3/1984 | Nishizawa et al. | 427/38 |
| 4,438,723 | 3/1984 | Cannella et al. | 118/719 X |
| 4,622,918 | 11/1986 | Bok | 118/719 X |

Primary Examiner—Bernard Pianalto
Attorney, Agent, or Firm—Fitzpatrick, Cella, Harper & Scinto

[57] ABSTRACT

There is disclosed an apparatus for forming deposited film which forms deposited film on a substrate by introducing a gaseous starting material for formation of deposited film and a gaseous oxidizing agent having the property of oxidation action for said gaseous starting material through separate routes respectively into a film forming space to thereby effect chemical contact therebetween, comprising one or two or more chambers for formation of deposited film and one or two or more etching chambers for etching at least one of said substrate and the deposited film formed on the substrate connected to one another.

17 Claims, 11 Drawing Sheets

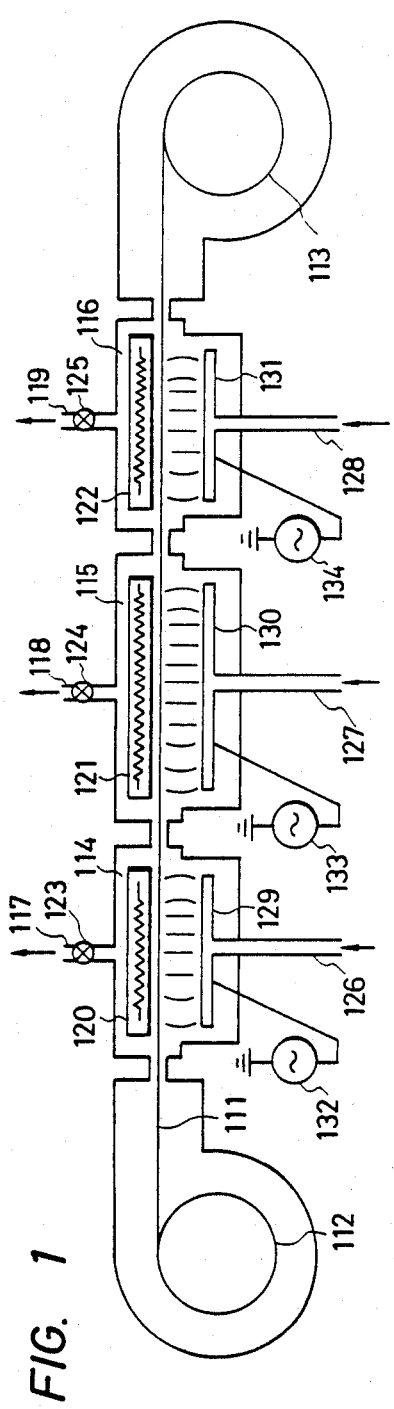
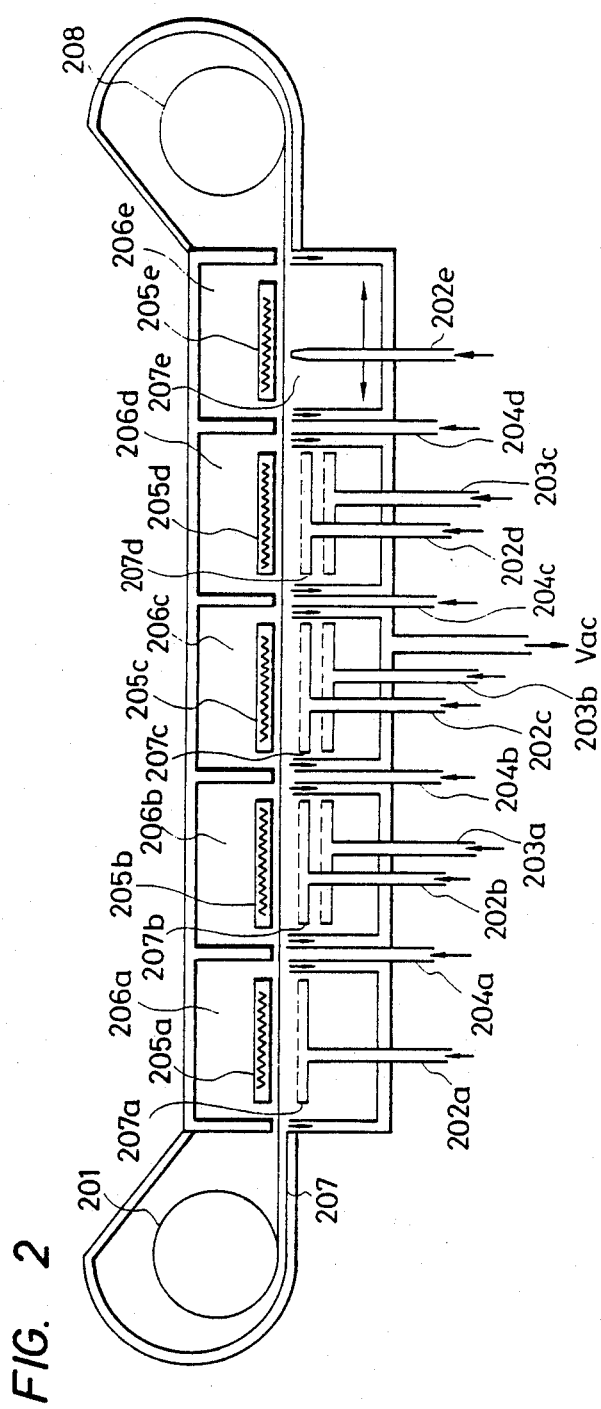
FIG. 1
FIG. 2

APPARATUS FOR FORMING DEPOSITED FILM

BACKGROUND OF THE INVENTION

1. Field of the Invention

This invention relates to an apparatus for forming a deposited film useful for uses of functional film, particularly semiconductor device, photosensitive device for electrophotography, electronic device such as optical input sensor device for optical image inputting device, etc.

2. Related Background Art

In the prior art, for example, as a photovoltaic device, a device having a photoelectric converting layer constituted of an amorphous material made of silicon atoms as the matrix, namely so called amorphous silicon (hereinafter represented as "a-Si"), on a substrate has been known.

As the method for forming a-Si film constituting the photoelectric converting layer of such photovoltaic device, some methods have been proposed, including the vacuum vapor deposition method, the ion plating method, the reactive sputtering method, the thermal CVD method, the plasma CVD method, the optical CVD method, etc. Among them, the plasma CVD has been practically applied as the most suitable method, and generally widely known.

Whereas, the photoelectric converting layer constituted of a-Si of the prior art, for example, one obtained by the plasma CVD method is enriched in exhibiting characteristics and has been accepted as satisfactory for the time being, but yet problems remain before solving the task of satisfying comprehensively all of the points required for establishing sure products, including the points of electrical, optical, photoconductive characteristics, fatigue resistance characteristics by repeated uses, use environment characteristic, the points of stability and durability with lapse of time, and further the point of homegeneity. This is greatly because the desired photoelectric converting layer is not a type which can be obtained by simple layer deposition operations, but above all skilled contrivances are required in the operational steps, although the materials employed may involve some problems In this connection, for example, in the case of the thermal CVD method, after dilution of a silicon type gaseous material, the so called impurity is mixed and then the materials are pyrolyzed at a high temperature of 500° to 650° C. Accordingly, for formation of a desired a-Si film, precise step operation and control are demanded, whereby the device becomes complicated and considerably higher in cost. Even so, it is extremely difficult to obtain steadily photoelectric converting layers constituted of a-Si which is homogeneous and has the desired characteristics as mentioned above, and therefore such device can be employed on an industrial scale with difficulty.

Also, in the plasma CVD method generally widely used as the best method as described above, there exist some problems in step operations, and also problems in installation investment. As to the step operations, their conditions are further more complicated than the thermal CVD method as described above and can be generalized with extreme difficulty. For example, by referring merely to the relationship parameters of substrate temperature, flow rates and flow rate ratios of the gases introduced, pressure during layer formation, high frequency power, electrode structure, structure of reaction vessel, evacuation speed, plasma generating system, there already exist so many parameters. In addition, other parameters still exist, and therefore strict selection of parameters is required for obtaining a desired product and, because of strictly selected parameters, if one of the constituent factors, above all plasma may become unstable state, the film formed will be remarkably badly affected to give no acceptable product. And, as to the device, since strict selection of parameters is required as described above, its structure will become of itself complicated, and it must be designed so as to correspond to the parameters individually selected strictly according to the change in the scale and the kind of the device. For such reasons, the plasma CVD method, which has been presently accepted the best method, requires enormous installation cost for the device if bulk production of desired a-Si film is to be performed. Even by doing so, there are so many and complicated step management items for bulk production, with the step management tolerance being narrow and also the device control being severe. Consequently, the product obtained are considerably high in cost.

On the other hand, photovoltaic devices are becoming diversified, and it is socially demanded to supply photovoltaic devices having photoelectric converting layers constituted of stable a-Si films satisfying comprehensively the requirements of various characteristics, etc., as mentioned above, and also corresponding to the objects, uses to be applied, and which are sometimes made to have enlarged area, at low cost and steadily, and there is the situation in which development of the method and the device satisfying this demand is earnestly desired.

These are also applicable to other layers, for example, layers comprising a-Si film layer containing at least one selected from among oxygen atoms, carbon atoms, and nitrogen atoms.

Also, as another problem of the device for forming deposited film of the prior art, when effecting, for example, etching as the treatment before or after formation of deposited film, if treatment is conducted by use of separate devices corresponding to the respective treatments, the material to be treated is attached with dust to give rise to flaws, which caused badness such as leak after formed into a device.

On the other hand, when a device having desired performance is prepared by use of an amorphous semiconductor, it can be realized by laminating layers different in electroconductivity, activation energy or optical band gap such as p-type impurity conductive layer, n-layer impurity conductive layer, genuine semiconductor layer, narrow band gap layer, wide band gap layer, etc., by using, for example, the plasma CVD method and varying the gas composition.

For the purpose of effecting good film formation without lowering the performance of the device with the laminated constitution, it is desirable to perform film formation continuously without breaking vacuum during lamination in order to prevent the interfaces from formation of unnecessary levels. Also, it is necessary to prevent entrainment of the doping gas, etc., in the preceeding steps as the impurity. For this purpose, by making avail of the characteristics of the amorphous material with great tolerance of substrate selectivity, in forming the above lamination type semiconductor film on a flexible lengthy film such as plastic or metal plate, the so called Roll-to-Roll method has been employed.

This method, as disclosed in U.S. Pat. No. 4,389,970, comprises arranging films such of stainless steel which can be wound up in rolls so as to be wound up through some film forming chambers, shielding the whole system from the air, and conveying the film at a predetermined speed through film forming chambers while winding up the film, thereby laminating successively necessary layers on the film which is the substrate.

FIG. 1 illustrates the basic constitution of the principal portions of a preferred embodiment of the bulk production type vacuum film forming device according to the plasma CVD method of the prior art which laminates p, i, n type semiconductor layers by the Roll-to-Roll method, which is described in detail below.

111 is a substrate and it is moved continuously from the delivery roller to the take-up roller 113.

The laminated film forming chambers 114, 115, 116 are evacuated by evacuating pipes 117, 118, 119 to be maintained at vacuum.

The substrate 111 is heated by the heaters 120, 121, 122 within the deposited film forming chambers 114, 115, 116 for depositing p, i, n type semiconductor layers.

The starting material gases for film formation such as $SiH_4$, $B_2H_6$, $PH_3$, $CH_4$, etc., and inert gases such as Ar, He, etc., are introduced through the gas introducing pipes 126, 127, 128 and the inner pressures are controlled suitably by the valves 123, 124, 125.

Further, high frequency voltages are applied by power sources 132, 133, 134 on the electrodes 129, 130, 131 to generate plasma and form desired p, i, n type semiconductor films respectively in the deposited film forming chambers 114, 115 and 116.

Also, in the above continuous deposited film forming device, although there are some advantages, the essential problems of the plasma CVD method still remain as described above.

Further, of the semiconductor devices, the present problems in a-Si semiconductor photovoltaic devices are lowering in cost and enhancement of efficiency. Particularly, the following points are obstacles against the problem of enhancement of efficiency.

(1) Since the carrier diffusion length in a-Si is too small, electrons, positive holes generated by light cannot be effectively collected in the p, n layer.

(2) Since the a-Si light absorption end energy is great, only a part of the natural sunlight spectrum can be absorbed to make the effective utilization percentage lower.

(3) Curved line factors due to series resistance are lowered as in large area device, etc.

Among these, for the purpose of solving the problem (1), the method of improving utilization efficiency of sunlight by dividing the sensitivity region of the sunlight spectrum into multi-layers is the most excellent, and researches of this method have been recently actively performed, partly because a multi-layer structure of a continuously connected structure (hereinafter called "tandem structure") can be easily formed in an amorphous semiconductor device.

Also, when forming a semiconductor device of a tandem structure as described above, the interface characteristics of the respective semiconductor film, particularly between the respective structural elements, for example, the interface characteristics between the respective nip elements in the case of a double layer structure device are important factors for energy converting efficiency, and there has been employed the method in which the respective semiconductor forming chambers are separated by vacuum in order to improve the interface characteristics and prevent mixing of the respective impurities during the reaction.

The bulk production type vacuum separation film forming device according to the plasma CVD method of the prior art for forming a double layer structure device of the substrate/nip/nip type according to the Roll-to-Roll method is disclosed in, for example, the above U.S. Pat. No. 4,389,970. The above mentioned problems are not also solved in the device described in said U.S. Patent.

SUMMARY OF THE INVENTION

A main object of the present invention is to provide a device for forming deposited film, which has removed the problems by the thermal CVD method or the plasma CVD method as described above and is capable of producing electronic devices continuously.

Another object of the present invention is to provide a device capable of forming continuously deposited films without utilizing the plasma reaction.

Still another object of the present invention is to provide a device for forming deposited film capable of producing continuously electronic devices having a multilayer structure, which has been devised to accomplish simplification of management of film forming conditions and bulk production of films while maintaining characteristics of the films formed and improving deposition speeds.

Still another object of the present invention is to provide which can perform continuously, for example, etching treatment as the treatment before or after formation of deposited films, thereby effecting improvement of characteristics or bulk productivity of electronic devices.

Still another object of the present invention is to provide a novel device for forming continuously deposited film without use of the plasma reaction, which can accomplish lowering of badness percentage and simplification of the device simultaneously with improvement of film characteristics.

Still another object of the present invention is to provide a device for forming deposited film, which can perform also patterning of electrodes, etc. continuously in addition to formation of semiconductor thin films, whereby device formation of deposited films can be made easier to enable bulk production easily at low cost.

Still another object of the present invention is to provide a device for forming deposited film capable of giving deposited films having uniform characteristics over a large area with conservation of energy simultaneously with easy management of film quality.

Still another object of the present invention is to provide a device for forming deposited film capable of giving films excellent in productivity, bulk productivity, and also having high quality with excellent physical characteristics such as electrical, optical, semiconductor characteristics, etc.

Still another object of the present invention is to provide a device for forming deposited film which forms deposited film on a substrate by introducing a gaseous starting material for formation of deposited film and a gaseous oxidizing agent having the property of oxidation action for said gaseous starting material through separate routes respectively into a film forming space to thereby effect chemical contact therebetween, comprising one or two or more chambers for formation of deposited film and one or two or more etching chambers for etching at least one of said substrate and the deposited film formed on the substrate connected to one another.

Still another object of the present invention is to provide a device for forming deposited film which forms deposited film on a substrate by introducing a gaseous starting material for formation of deposited film and a gaseous oxidizing agent having the property of oxidation action for said a gaseous starting material through separate routes respectively into a film forming space to thereby effect chemical contact therebetween, comprising one or two or more chambers for formation of deposited film, one or two or more etching chambers for etching at least one of said substrate and the deposited film formed on the substrate and one or two or more electroconductive film forming chambers for forming electroconductive film on the surface of at least one of said substrate and the deposited film deposited on the substrate connected to one another.

BRIEF DESCRIPTION OF THE DRAWINGS

FIG. 1 illustrates schematically a device for forming deposited film of the prior art;

FIG. 2 illustrates schematically a first embodiment of the present invention;

DESCRIPTION OF THE PREFERRED EMBODIMENTS

Figure 3A:
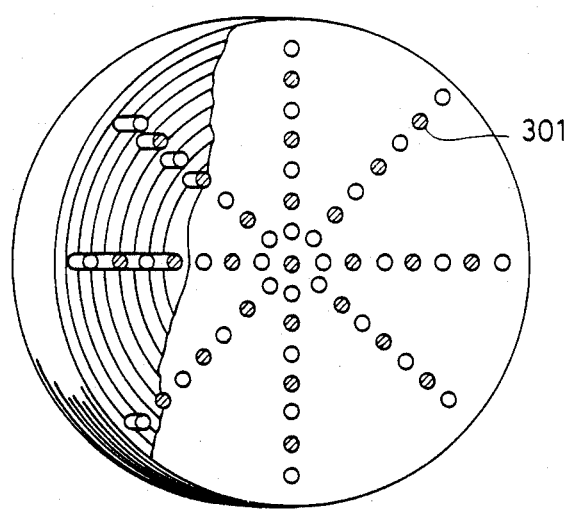
FIG. 3, FIG. 7 and FIG. 8 each illustrate schematically the gas jetting portion of the device of the present invention.

FIG. 2 shows an example of the device of the invention, showing the case when the chambers for formation of deposited films for the respective layers of photoelectric converting layers of a pin type photovoltaic device and the etching chamber are arranged as continuously separated.

In the device shown in FIG. 2, the substrate conveyed from a delivery roller 201 is first surface coarsened in the etching chamber 206a, then passes through the respective deposited film forming chambers 206b, 206c, 206d where depositions of n, i and p respective layers occur and, via the space 206e for partial etching treatment, is taken up by a take-up roller 208. Into the respective deposited film forming chambers 206b, 206c and 206d are introduced gaseous oxidizing agents through the gas introducing pipes 206b, 206c and 206d, and gaseous starting materials for formation of deposited films through 203b, 203c and 203d.

Behind the substrate 207 opposed to these introducing pipes, there are heaters 205b, 205c and 205d. which perform heating the substrate 207. Deposition of the respective photoelectric converting layers in these three deposited film forming chambers 206b, c, d can be performed smoothly by conveying the substrate 207 from the delivery roller 201 to the take-up roller, and the respective deposition speeds are controlled by inner pressure, gas flow rates, substrate temperature so as to give appropriate film thicknesses.

Into the etching chambers 206a, e are fed the gaseous halogenic substance through the gas introducing pipes 202a, e, respectively. The gas jetting portions 207a, e of these gas introducing pipes are required to determine their forms depending on the purpose and, when the whole surface of the substrate 207 is subjected to coarsening, a gas jetting portion having a large number of jetting orifices provided radially, for example, as shown in FIG. 3A, and interval 302 between the jetting orifices 301 may be suitably determined.

Figure 3B:
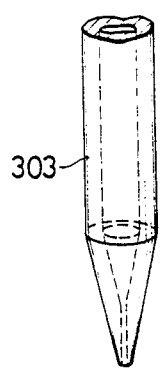
Figure 4:
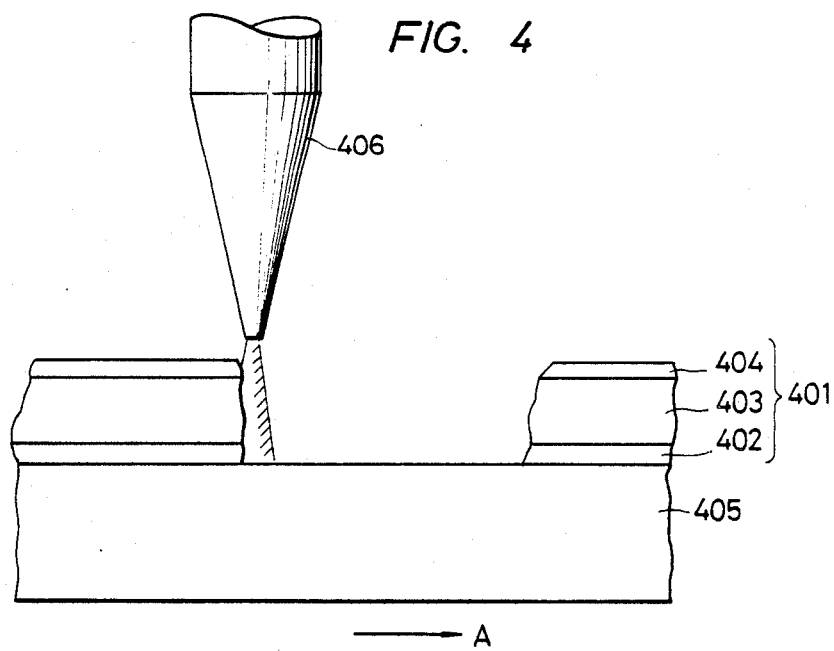
FIG. 4 and FIG. 15 each illustrate schematically the etching treatment performed by the device of the present invention.

Also, partial etching as shown in FIG. 4 may be effected. For example, when only the photoelectric converting layer 401 is etched with the substrate 405 (207 in FIG. 2) being remained, as jetting portion 303 as shown in FIG. 3B (406 in FIG. 4) is used. In this case, as shown in FIG. 4, in the etching chamber 206e in FIG. 2, etching of the layer 402 deposited in the deposited film forming chamber 206b, the layer 403 deposited in the deposited film forming chamber 206c and the layer 404 deposited in the deposited film forming chamber 206d is effected. By this etching, for example, the deposited film can be severed to separate the deposited film into a large number of segments corresponding to the shape of the desired device.

The jetting orifice 406 can be moved either in parallel to the progress direction A of the substrate or vertically thereto to draw a groove along the design, with the distance from the substrate 407 being maintained constant.

The method for forming deposited film to be applied for the device for forming deposited film of the present invention is a novel CVD method proposed previously by the same applicant (hereinafter called the FOCVD). That is, according to said FOCVD method, a substance cotributing to formation of a semiconductor layer but having no ability to form a deposited film at all under the energy state of its own and a substance which is capable of reacting with said substance and oxidizing it by electronic theory (increasing the oxidation number of atom)(hereinafter called "oxidizing agent) are selected, and introduced under gaseous state into a simple reaction zone where a substrate maintained at a temperature of, for example, 200° to 300° C. exists through the routes separate from each other and permitted to contact each other in the upper space above the substrate surface, whereby chemical mutual interaction occurs between both to form a deposited film on the substrate surface with an extreme efficiency without formation of any solid particle at all.

Besides, the deposited film is homogeneous, having excellent electrical and optical characteristics, and has been confirmed to give excellent photoelectric converting efficiency when applied for a photoelectric converting layer in a photovoltaic device.

In the above chamber for forming deposited film constituting the device for forming deposited film of the present invention, as described above, since there is no action of no discharging energy, namely no plasma reaction, no bad influence is received by etching or other actions (e.g. abnormal discharging) during film forming operation. Also, the respective layers are continuously formed by lamination in film forming spaces separated from each other, and therefore there is no entrainment of impurity to give a deposited film structure which is dense and of high quality. Further, the thin film semiconductor layer obtained has excellent characteristics as well as high semiconductor characteristics. Accordingly, for example, the photovoltaic device produced by use of this can have high quality.

Also, since formation of a desired deposited film (photoelectric converting layer) having a uniform film thickness and homogeneous characteristic as a whole is rendered possible by merely introducing a starting material and an oxidizing agent into a film forming space and permitting the both materials to contact each other, in addition to easy management of the operational steps, the energy used can be small in amount, whereby the installation investment can be by far smaller as compared with the prior art and bulk production is rendered possible.

In the present invention, the numbers or arrangements of the deposited film forming chambers and etching chambers as mentioned above can be selected as desired, respectively. For example, when preparing a photovoltaic device of the pin type, etc., by connecting three chambers for forming deposited film to one another and passing successively through these chambers for formation of deposited film, the p-type layer, i-type layer and n-type layer as mentioned above can be formed by lamination successively.

Also, according to the device for forming deposited film of the present invention, simultaneously with conservation of energy, simplification of management and bulk production can be effected with full satisfaction of film thickness uniformity and film quality uniformity without requiring enormous installation investment for bulk production device, and also management items for bulk production thereof become clear to make management tolerance broader and control of the device easier.

Further, by use of the device for forming deposited film of the present invention in a process for producing a semiconductor, no masking is required to improve bulk productivity and also enable highly reliable and highly functional semiconductors at low cost.

Next, the constitution and the action of the device for forming deposited film of the present invention is described in detail by referring to examples of photovoltaic device.

The semiconductor device provided by the device for forming deposited film of the present invention may be exemplified by photovoltaic devices typically shown by FIGS. 5A to 5D.

That is, the example shown in FIG. 5 A is a photovoltaic device in the form of effecting photoirradiation from the electroconductive layer side, which is applicable for a solar battery.

Figure 5A:
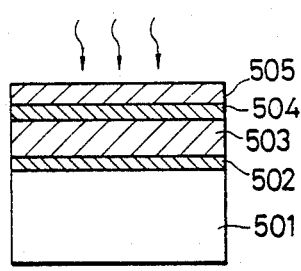
FIGS. 5A–5E and FIGS. 16A–16C each illustrate schematically the sectional view of the layer constitution of the photovoltaic device prepared by the device of the present invention.

In FIG. 5A, 501 represents a substrate, 502 a semiconductor layer (p-type or n-type), 503 an i-type semiconductor layer, 504 a semiconductor layer (n-type or p-type) and 505 an electroconductive layer, respectively.

The example shown in FIG. 5 B has substantially the same constitution as that in FIG. 5 A, but it is a photovoltaic device of the type having an electroconductive layer provided on a substrate to effect photoirradiation from the side opposite to the substrate, which is also applicable for a solar battery.

Figure 5D:
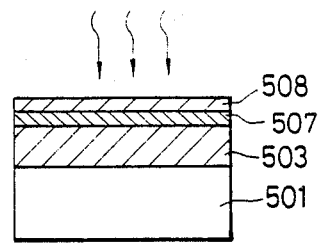
Figure 5B:
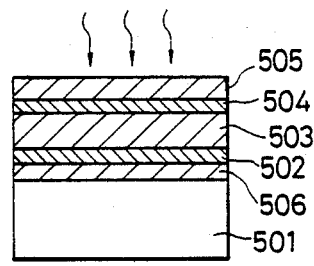
Figure 5E:
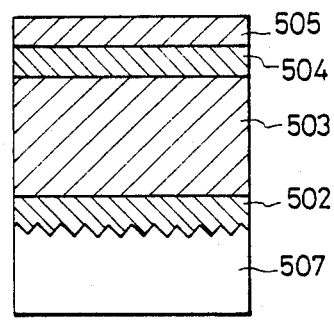

The example shown in FIG. 5 C is a photovoltaic device similar to that shown in FIG. 5B, but it is of the type to effect photoirradiation from the substrate side.

Figure 5C:
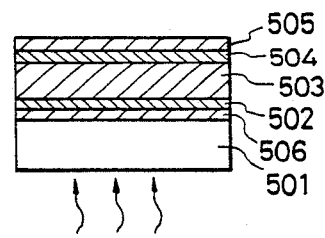

In FIGS. 5B and 5C, 501 represent a support, 502 and 504 semiconductor layers (p-type or n-type), 503 an i-type semiconductor layer and 506 an electroconductive layer, respectively.

The example shown in FIG. 5 D is a photovoltaic device of the type having a photoconductive layer (i-type semiconductor layer), an insulating layer and a metal layer on a support to effect photoirradiation from the metal layer side, which is also applicable for a solar battery.

In FIG. 5 D, 501 represents a support, 503 an i-type semiconductor layer, 507 an insulating layer and 508 a metal layer.

For every type shown in FIG. 5 A through 5 D, the shape of the support may be determined depending on the shape of the photovoltaic device to be prepared, and selected from cylindrical, belt, plate or other shapes. The support may be either optically transparent or opaque, but the support is made optically transparent in the case of the type to effect photoirradiation from the support side.

The material of the support may be either electroconductive or electrically insulating. As the electroconductive substrate, there may be mentioned metals such as Al, Cr, Mo, Au, Nb, Ta, V, Ti, Pt, Pd etc. or alloys thereof such as Ni-Cr, stainless steel, etc. As insulating substrates, there may be conventionally used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby imparting electroconductivity to the surface. And the thickness of the substrate, which may be determined suitably so that a desired photovoltaic device may be obtained, is generally made 10 μm or higher in view of manufacturing, handling, mechanical strength, etc. of the substrate.

The semiconductor layers 502–504 in the photovoltaic device of the type shown in FIGS. 5A to 5D are constituted mainly of an amorphous silicon containing silicon atoms (Si) and at least one of hydrogen atoms (H) and halogen atoms (X) [hereinafter called a-Si(H,X)]. And, when said semiconductor layer is of the p′ type giving p-type semiconductivity, the so called p-type impurity in the field of semiconductor (hereinafter called merely as "p-type impurity") is contained in the layer. Further, as shown in FIG. 1 (C), in the case of a photovoltaic device of the type to effect photoirradiation from the substrate side, the semiconductor layer 2 should desirably bring about the so called window effect and, for that purpose, is constituted mainly of an amorphous silicon made to have a wide band gap containing at least one of band gap controlling elements of carbon (C), oxygen (O), nitrogen (N), etc.) in a-Si(H,X) [hereinafter called a-Si(H,X)(C,O,N)].

On the other hand, when the photovoltaic device is of the type to effect photoirradiation from the side opposite to the substrate as shown in FIGS. 5A, 5B, the semiconductor layer 502 is the n-type which gives the n-type conductivity, and therefore said semiconductor layer contains the so called n-type impurity in the field of semiconductor (hereinafter called merely "n-type impurity") therein.

In every case as described above, the semiconductor layer 502 may have a thickness generally of 30 to $5 \times 10^4$ Å, preferably of 50 to $5 \times 10^3$ Å, more preferably of 50 to $1 \times 10^3$ Å.

Also, as described above, the p-type impurity contained when the semiconductor layer 502 is of the p-type, may include elements of the group IIIA of the periodic table (hereinafter called merely the group III elements), namely B, Al, Ga, In, Tl, etc. as suitable examples, optimally above all B and Ga.

The n-type impurity contained when the semiconductor layer 502 is of the n-type may include elements of the group VA of the periodic table (hereinafter called merely the group V elements), namely N, P, As, Sb, Bi, etc. as suitable ones, optimally above all As, P and Sb.

These p-type or n-type impurities are contained in the semiconductor layer 502 by doping in the process of preparing said layer, and their amounts may be determined suitably in view of factors such as desired electrical, optical characteristics, etc. As to the p-type impurity, it may be generally $3 \times 10^{-2}$ atomic % or less, while the n-type impurity may be generally $5 \times 10^{-3}$ atomic % or less.

The i-type semiconductor layer 503 in the photovoltaic force of the type shown in FIG. 5A through D has a multi-layer constitution made to have a multi-band gap having photoconductive characteristics exhibiting fully the photovoltaic function, comprising a layer region of an amorphous silicon nitrogen containing silicon atoms and nitrogen atoms (N) as the element for controlling band gap, and at least one of hydrogen atoms (H) and halogen atoms [hereinafter called a-SiN(H,X)], a layer region of a-Si(H,X) and a layer region of an amorphous silicon germanium containing silicon atoms and germanium atoms (Ge), and at least one of hydrogen atoms (H) and halogen atoms (X) [hereinafter called a-SiGe(H,X)].

The layer thickness of such an i-type semiconductor layer 503 should be determined depending on the relationship mutually between the layer thicknesses of the p-type semiconductor layer and the n-type semiconductor layer, the relationships between the amounts dopes in both of said layers, etc. so that the function of said i-type semiconductor layer as well as the functions of the p-type semiconductor layer and the n-type semiconductor layer may be fully and effectively exhibited. Usually, however, it is made several-fold to some ten-fold of the layer thickness of the p-type semiconductor layer, n-type semiconductor layer.

Specifically, it may be preferably 100 Å to 10μ, more preferably 0.1 to 1μ.

The semiconductor layer 504 is a p-type semiconductor layer in the photovoltaic device shown in FIG. 5 (A), (B), while it is a n-type semiconductor layer in the case of the photovoltaic device shown in FIG. 5 (C). In any case, the main layer consists of a-Si(H,X), but in the type shown in FIG. 5 (B), it is constituted of a-Si(H,X)(C,O,N) which is made to have a wide band gap to bring about the so called window effect. And, similarly as described above, in the former case is contained a n-type impurity, while a p-type impurity, by doping, in the respective layers in the process of preparation thereof.

Of the layers constituting the semiconductor layer, wide band gap is generally imparted to the p-type semiconductor layer, but it may also of course be imparted not to the p-type semiconductor layer but to the n-type semiconductor layer. And, the degree of wide band gapping should desirably be greater than that in the i-type semiconductor layer as described above.

In the optical photoelectroconductive device shown in FIG. 5 (A) through (B), the electroconductive layer 505 is formed of a transparent electroconductive material. Particularly, when the support 501 is transparent, in order to effect photoirradiation from the electroconductive layer 505 side, said electroconductive layer is require to be transparent or approximate thereto to obtain sufficient photoelectric converting efficiency.

Examples of such transparent electroconductive material may include thin metal films of $In_2O_3$, $SnO_2m$ ITO ($In_2O_3+SnO_2$), or PD, Pt, Cu, Ag, Au, Al, etc. Examples of opaque electroconductive materials may include mos of metal films such as NiCf, Al, Cr, Mo, Au, Ir, Nb, Ta, V, Ti, Pt, Pd, Zn, Ag, etc.

In the photovoltaic device shown in FIG. 5(D), while the support 501 and the semiconductor layer 503 are as described above, the metal layer 508 is formed by use of a metal having a great work function such as Au, Pt, Pd, etc. for formation of a Schottky junction with the semiconductor layer 503. Such a metal layer 508 is formed on the semiconductor layer 503 by vacuum resistance heating vapor deposition or electron beam heating vapor deposition. For photoirradiation on the semiconductor layer 503 through the metal layer 508, said metal layer 507 should preferably have a film thickness of 500 Å or less.

507 is an insulating layer and it is formed very thinly (generally 2000 Å or less) in order to reinforce the barrier layer for the semiconductor layer 503 and the metal layer 508. The insulating layer 507 is not necessarily required. The insulating layer 507 is formed as the layer made to have a wide band gap which is formed by addition of a gas containing N such as $N_2$, $NH_3$, NO, $NO_2$, etc., a gas containing O such as $O_2$, $CO_2$, etc. or a gas containing C such as $CF_4$, $C_2F_6$, $CH_4$, etc. to the starting gas for formation of precursors or the gaseous oxidizing agent Next, the method for forming a photovoltaic device characterized by having a specific photoelectric converting layer as described above in the device for forming deposited film of the present invention comprises introducing a material which contribute to formation of the above photoelectric converting layer, has little or not ability of forming a deposited film under the energy condition of its own, but can bring about formation of deposited film under excited state (hereinafter called "starting material (A)" and a material which can oxidize said starting material (A) through mutual interaction therewith by electron theory (increase the oxidation number of atom) ("oxidizing agent") under gaseous state through the routes separate from another into a reaction zone in absence of electrical field in which a substrate for photovoltaic device is placed, permitting them to contact each other in the space above the substrate surface to cause chemical mutual interaction to occur between both, thereby forming succesively continuously deposited films which are desired photoelectric converting layers on the above substrate surface in the deposition spaces separated from each other.

Whereas, the method for producing the photovoltaic device of the present invention does not employ the action of a discharging energy such as plasma, and therefore no plasma reaction is utilized. Thus, the deposited film formed, namely the photoelectric converting layer formed will not be badly affected by etching or other actions such as abnormal discharging, etc. during film forming operation. As the result, the respective layers constituting the photoelectric converting layers continuously and in the separated deposition spaces have dense structures (because of no entrainment of impurity) and high quality, having converting efficiency, whereby the photoelectric converting device produced has high quality. And, since the method for producing the photovoltaic device of the present invention can also form a desired deposited film (photoelectric converting layer having a uniform thickness and homogeneous characteristics as a whole by merely introducing the starting material (A) and the oxidizing agent into a reaction zone thereby permitting both materials to contact each other, the amount of energy used can be small in addition to easy management of the operational steps and the installation for the device to be used can be by far smaller as compared with that of the prior art, and also bulk production is rendered possible.

The gaseous starting material (A) in the method of the present invention receives oxidizing action through chemical contact with a gaseous oxidizing agent to be activated, thereby forming substances under excited state which are feeding sources for the deposited layer (photoelectric converting layer), namely precursors, and therefore they may be maintained gaseous during contact with the gaseous oxidizing agent. Accordingly, they are not necessarily required to be gaseous before use but may be either liquid or solid. When the starting material (A) is liquid or solid before use, it is introduced in gaseous state into the system while performing bubbling with the use of a carrier gas such as Ar, He, $N_2$, $H_2$, etc., optionally with application of heat.

On the other hand, the oxidizing agent has the property of activating the starting material (A) to form substances under excited state, namely precursors for film formation through its oxidation action by more contact with the above gaseous starting material and typical examples thereof may include oxygens such as air, oxygen, ozone, etc., compounds of oxygen or nitrogen such as $N_2O_5$, $N_2O_3$, $N_2O$. etc., peroxides such as $H_2O_2$, halogenic gases such as $F_2$, $Cl_2$, $Br_2$, $I_2$, etc.

These oxidizing agents may be also maintained gaseous during contact with the gaseous starting material for precursors. Accordingly, they are not necessarily required to be gaseous before use, but may be either liquid or solid. When the oxidizing agent is liquid or solid, similarly as the above starting material for precursors, they are introduced under gaseous state while performing bubbling with the use of a carrier gas such as Ar, He, $N_2$, $H_2$, etc., optionally with application of heat.

The starting material (A) (gaseous) and the oxidizing agent (gaseous) as described above are introduced through the passages separate from each other into the system which is a reaction zone in which a substrate is placed under controlled feeding pressures and flow rates so that both may flow into the film forming space above the substrate to contact each other by mixing and collision, whereby the starting material (A) is oxidized and activated by the oxidizing agent to form precursors under excited state and form a deposited film on the substrate surface.

As for the combination of the starting material (A) and the oxidizing agent as described above, they can be selected suitably depending on the kind of the layer constituting the photoelectric converting layer to be formed on the substrate for photovoltaic force.

For example, for formation of a p-type a-Si(O,C,N)(H,X) layer, in addition to the compounds containing silicon as the constituent such as silanes, including $SiH_4$, $Si_2H_6$, $Si_3H_8$, $Si_4H_{10}$, etc., halogenated silanes, including $SiH_3Cl$, $SiH_3F$, $SiH_3Br$, etc., nitrogen compounds such as $N_2$, $NH_3$, $H_2NNH_2$, $HN_3$, $NH_4N_3$, etc. or hydrocarbon compounds such as $C_2H_6$, $C_3H_8$, $C_2H_4$, $C_3H_6$, $C_2H_2$, etc. may be employed, and further compounds containing the group III atom as the constituent which are the starting materials for introduction of the p-type impurity such as $B_2H_6$, $B_4H_{10}$, $B_5H_9$, $B_5H_{11}$, $B_6H_{10}$, $B_6H_{11}$, $Al(CH_2)_3$, $Al(C_2H_5)_3$, $Ga(CH_2)_3$, $In(CH_2)_3$, etc. may be employed. On the other hand, as the above oxidizing agent, halogenic gas, nalogen gas under nascent state (these are called "halogenic oxidizing agent") and at least one selected from $O_2$, $O_3$, $N_2O_4$, $N_2O_3$, $N_2O$ (these are called "oxygen type, nitrogen type oxidizing agent") may be employed.

For formation of an i-type semiconductor layer constituted of a-Si(O,C,N)(H,X), as the above starting material (A), at least one selected from among the compounds containing silicon as the constituent such as silanes, halogenages silanes, etc., nitrogen compounds as mentioned above and carbon compounds as mentioned above may be employed and, as the above oxidizing agent, halogenic oxidizing agent and/or oxygen type, nitrogen type oxidizing agent may be employed.

Further, for formation of a n-type a-Si(H,X) layer, as the above starting material, a silicon compound such as silanes, halogenic silanes, etc. may be employed, and a compound containing the group V atom as the constituent such as $PH_3$, $P_2H_4$, $AsH_3$, $SbH_3$, $BiH_3$, etc. may be contained therein. Also, as the above oxidizing agent, a halogenic oxidizing agent such as halogen gas, halogen under nascent state, etc. may be employed.

Further, in the case of constituting a p-type, i-type or n-type semiconductor layer of a film consisting of a-SiGe, in addition to the starting material (A) for formation of each semiconductor layer, a starting material for introduction of germanium atoms may be employed, and examples of such starting material (A) may include chain germanium compounds such as $GeH_4$, $GeH_6$, $Ge_3H_8$, $Ge_4H_{10}$, $Ge_5H_{12}$, etc.

Whereas, in the method for producing photovoltaic device of the present invention, so that the film forming steps may proceed smoothly to obtain a film of high quality having desired electrical, optical characteristics and also high photoelectric converting efficiency, it is necessary to select the kinds and the combination of the gaseous starting material (A), the gaseous oxidizing agent, the mixing ratio of these, the pressure during mixing, the flow rates, the pressure in the film forming space, the flow rate of the carrier gas, the film forming temperature, the flow rate of the as, etc. suitably as desired. And, these various factors in film formation are related organically with each other and cannot be determined individually, but they are required to be determined in view of their mutual relationships. For example, the ratio of the gaseous starting material (A) to the gaseous oxidizing agent may be, in terms of the flow rate ratio introduced, preferably 1/20 to 100/1, more preferably 1/5 to 50/1. On the other hand, the ratio of the gaseous starting material for introduction of the p-type impurity or the n-type impurity may be in terms of the flow rate ratio introduced, preferably $1/10^6$, more preferably $1/10^5$ to 1/20, optimally $1/10^5$ to 1/50. Further, the pressure during mixing of the gaseous starting material (A) and the gaseous oxidizing agent may be preferably high in order to ehnahce establishement of chemical contact, but preferably determined in view of reactivity, preferably $1 \times 10^{-7}$ to 10 atm., more preferably $1 \times 10^{-6}$ to 3 atm.

In the device for forming deposited film of the present invention, the gaseous starting material to be used for formation of an electroconductive film receives oxidation action through the chemical contact with the gaseous halogenic oxidizing agent, and may be selected suitably as desired depending on the kind, the characteristics, the use, etc. of the desired electroconductive film. In the present invention, the above gaseous starting material and the gaseous halogenic oxidizing agent may be those which can be made gaseous during the chemical reaction by contacting each other, and they may be either liquid or solid as ordinary state.

When the starting material for formation of a deposited film or a halogenic oxidizing agent is liquid or solid, the starting material for formation of an electroconductive film or the halogenic oxidizing agent are introduced in gaseous state into the reaction space while performing bubbling with the use of carrier gas such as Ar, He, $N_2$, $H_2$, etc., optionally with application of heat.

During this operation, the partial pressures and mixing ratio of the above gaseous starting material and the gaseous halogenic oxidizing agent may be set by controlling the flow rate of the carrier gas or the vapor pressures of the starting material for formation of the deposited film and the gaseous halogenic oxidizing agent.

The starting materials which can be made gaseous containing transition metals to be used in the present invention may include the compounds as set forth below.

Examples of compounds containing Cr may include halides, organic chromium compounds such as $CrBr_3$, $Cr(CO)_6$, $Cr(CO)_5$. $\{P(C_6H_5)_3\}$, $Cr(CO)_3(C_6H_6)$, $CrH(CO)_3$ $(C_5H_5)$, $Cr_2(CO)_6(C_5H_5)_2$, $Cr(C_6H_6)_2$, $Cr(C_5H_5)_2$, $Cr(CH_3)_4$, etc.

Examples of compounds containing Fe may include halides, organic iron compounds such as $FeCl_2$, $FeCl_3$, $FeBr_3$, $Fe_3(CO)_{12}$, $Fe(C_5H_5)_2Fe(C_5H_5)(CH_3COC_5H_4)$, $Fe(C_5H_5)(C_5H_4CHO)$, $Fe(C_5H_5)(CH_2=CHC_5H_4)$, $Fe(C_9H_7)_2$, etc.

Examples of compounds containing Mn may include halides, organic manganese compounds such as $Mn(C_5H_7O_2)_2$, $MnBr(CO)_5$, $Mn(CH_3)(CO)_5$, $Mn(CO)_4(C_3H_5)$, $Mn(CO)_3(C_5H_5)$, $Mn(C_5H_5)_2$, etc.

Examples of compounds containing Mo may include halides, organic molybdenium compounds such as $MoCl_3O$, $Mol_2Cl_5O_3$, $MoCl_4O$, $MoCl_2O_2$ $Mo_2(CH_3COO)$, $Mo(CO)_6$, $MoH_2(C_5H_5)_2$, $MoCl_5$, etc.

Examples of compounds containing Ta may include halides, organic tantalum compounds such as $TaCl_5$. $TaBr_5$, $TaCl_2(C_5H_5)_2$, $TaH_3(C_5H_5)_2$, etc, Examples of compounds containing V may include halides, organic vanadium compounds such as $VCl_3$, $VCl_4$, $VBr_2$, $VF_3O$, $VCl_3O$, $VBr_3O$, $V(CO)_6$, $V(CO)_4(C_5H_5)$, $V(C_5H_5)_2$, $VCl(C_5H_5)_2$, $V(C_6H_6)_2$. etc.

Examples of compounds containing Au may include halides, organic gold compounds such as $AuCl_3$, $Au(CH_3)_3$, $AuBr(CH_3)_2$, etc.

Also, in the present invention, as the gaseous oxidizing agent to be used in the etching step conducted continuous to the step for depositing photoelectric converting layer as described above, a halogenic oxidizing agent such as $F_2$, $Cl_2$, $Br_2$, $I_2$, FCl, etc. may be employed.

Whereas, in the present invention, so that the deposit film forming process may proceed smoothly to form a film of high quality and having desired physical characteristics at an appropriate film thickness at a desired portion, as the film forming factors, the kinds and combination of the starting material and the oxidizing agent, mixing ratio of these, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the ratio of the gaseous starting material for formation of a deposited film and the gaseous halogenic oxidizing agent introduced into the reaction space may be determined suitably as determined in relationship of the film forming factors related among the film forming factors as mentioned above, but it is preferably 1/20 to 100/1, more preferably 1/5 to 50/1 in terms of flow rate ratio introduced.

The pressure during mixing when introduced into the reaction space may be preferably higher in order to enhance higher the chemical contact between the above gaseous starting material and the above gaseous halogenic oxidizing agent in probability, but it is better to determine the optimum value suitably as desired in view of the reactivity. Although the pressure during mixing may be determined as described above, each of the pressure during introduction may be preferably $1 \times 10^{-7}$ atm, more preferably $1 \times 10^{-6}$ atm to 3 atm.

The pressure within the film forming space, namely the pressure in the space in which the substrate for film formation on its surface is arranged may be set suitably as desired so that the precursors (E) under excited state generated in the reaction space and sometimes the precursors (D) formed as secondary products from said precursors (E) may contribute effectively to film formation.

The inner pressure in the film forming space, when the film forming space is continuous openly to the reaction space, can be controlled in relationship with the introduction pressures and flow rates of the gaseous starting material for formation of a deposited film and a gaseous halogenic oxidizing agent in the reaction space, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation amount of said device.

On the other hand, when the reaction space and the film forming space is integrally made and the reaction position and the film forming position are only different in space, it is possible to effect differential evacuation or provide a large scale evacuating device having sufficient evacuating capacity as described above.

As described above, the pressure in the film forming space may be determined in the relationship with the introduction pressures of the gaseous starting material and the gaseous halogenic oxidizing agent introduced into the reaction space, but it is preferably 0.001 Torr to 100 Torr, more preferably 0.01 Torr to 30 Torr, optimally 0.05 to 10 Torr.

As for the flow rate of the gases, it is necessary to design the flow rate in view of the geometric arrangement of the gas introducing inlet, the substrate and the gas evacuating outlet so that the starting material for formation of a deposited film and the halogenic oxidizing agent may be efficiently mixed during introduction of these into the reaction space, the above precursors (E) may be efficiently generated and film formation may be adequately done without trouble.

For example, it is preferable to use a gas releasing means having orifices for releasing the gaseous starting material for formation of a deposited film and orifices for releasing the gaseous oxidizing agent having the property of oxidizing the gaseous starting material provided alternately.

Figure 6:
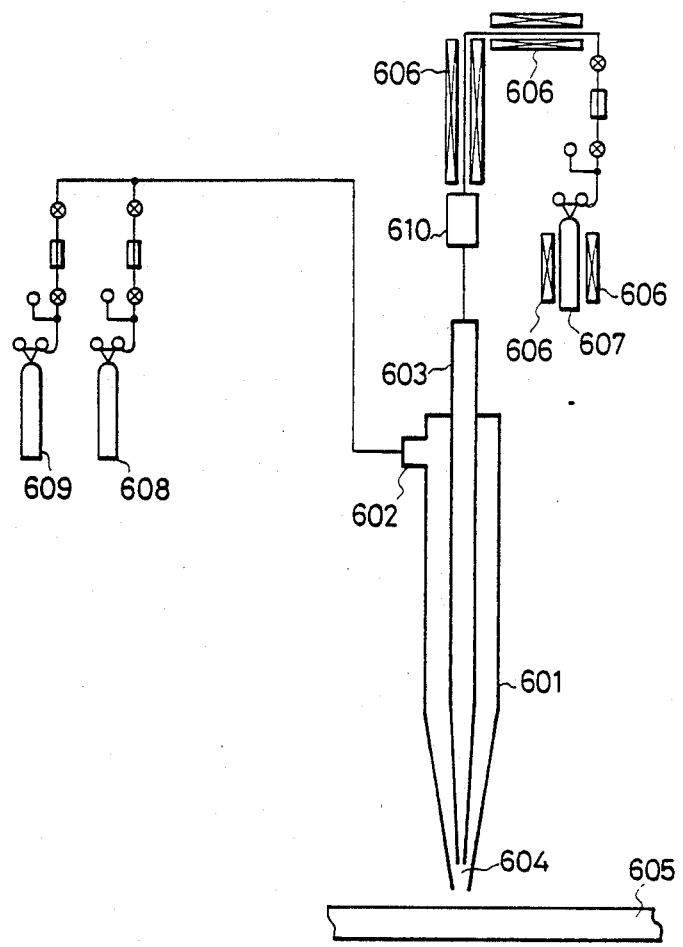
FIG. 6 illustrates schematically the main portion of the device when carrying out etching treatment.
Figure 7:
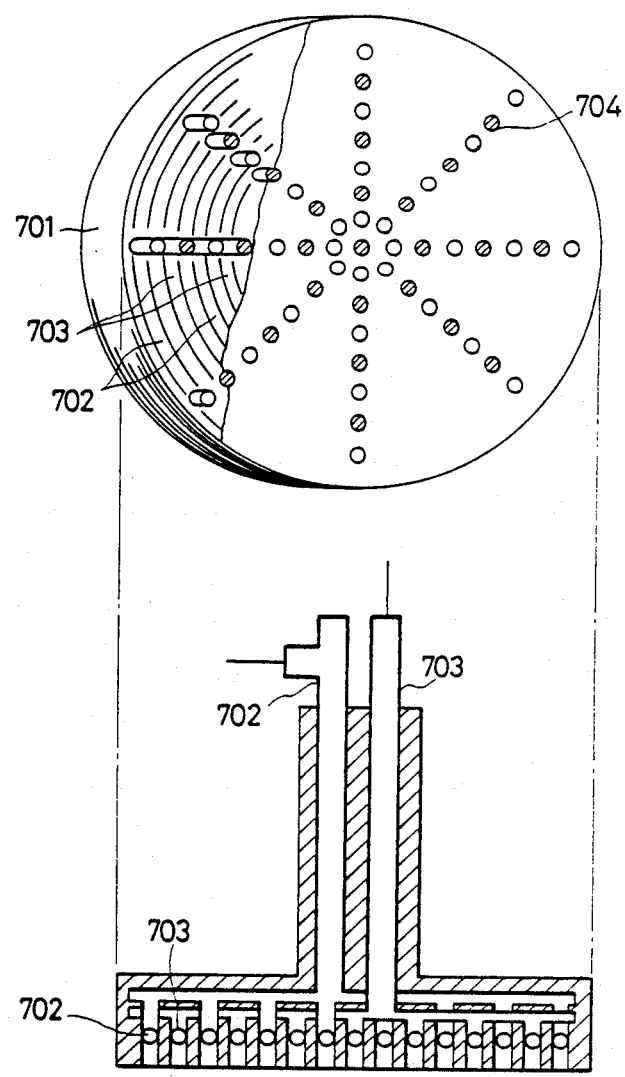

FIG. 6, FIG. 7 and FIG. 8 show schematically sectional views of the gas jetting portions to be used in the chamber for formation of deposited film, the chamber for formation of electroconductive film and the etching chamber in the present invention, respectively.

In the above chamber for forming deposited film, in the case of forming partially a semiconductor film or an electroconductive film, a narrowed gas jetting portion 601 as shown in FIG. 6 can be used, while in the case of depositing a semiconductor film or an electroconductive film uniformly over a wide range, a jetting portion 701 as shown in FIG. 7 can be used.

That is, in FIG. 6, the above starting material for formation of deposited film and the halogenic oxidizing agent are introduced respectively through the introducing pipe 602 or the introducing pipe 603, mixed in the vicinity of the gas jetting outlet 604 to be jetted out onto the substrate 605 and deposited locally thereon.

On the other hand, in FIG. 7, the gases are introduced similarly through the introducing pipe 702 or the introducing pipe 703 to be deposited over a wide range.

Figure 8A:
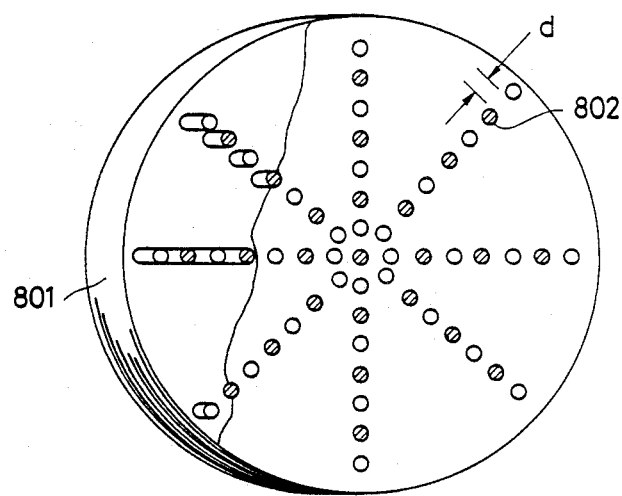
Figure 8B:
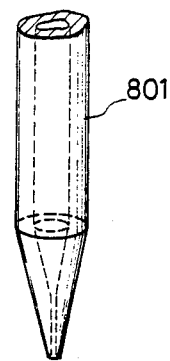

Also, in the above etching chamber, the gas jetting portions shown in FIGS. 8A, B are used and the jetting portion shown in FIG. 8 A is used when etching is effected over a wide range, while that shown in FIG. 8B is used when etching is effected partially When the gaseous oxidizing agent used for etching is employed as diluted, the jetting portions 601 and 701 shown in FIG. 6, FIG. 7 can be used, and the respective two systems of gas introducing pipes 602, 603 or 702, 703 are used for introducing gaseous halogenic oxidizing agent and inert gas for dilution, respectively Next, description is made about an example in which an electromotive device as shown in FIG. 5 E is trially prepared by means of the same device as shown in FIG. 2 First, a SUS plate shaped in a roll with a thickness of 0.7 mm was used as the substrate 207 (507 in FIG. 5E), and said substrate 207 was extended between a delivery roller 201 and a take-up roller 208. Then, with the main vacuum valve (not shown) being opened, the etching spaces 206a, e and the depositions spaces 206b, c, d were internally thoroughly evacuated. Also, heating was effected to a substrate temperature of 250° C. by the heaters 205a, b, c, d, e.

As the first step, the substrate 207 was coarsened on its surface by flowing $F_2$ gas through the introducing pipe 202c to effect the texture treatment so that light could be efficiently absorbed by the the photoelectric converting device.

$F_2$ gas (diluted to 10% with He) flow rate was 30 sccm and the inner pressure 1.5 Torr.

As the next step, in the deposition space 206b, on the coarsened surface of the substrate of SUS, for provision of a n-type a-Si:H:F:P semiconductor layer 502, film formation was conducted as described below by use of $SiH_4$ gas as the gaseous starting material, $PH_3$ gas as the starting material for introduction of the n-type impurity and $F_2$ gas as the gaseous oxidizing agent.

That is, $PH_3$ gas diluted to 500 ppm with He gas (hereinafter called "$PH_3$/He gas") at 10 sccm and $SiH_4$ gas at 20 sccm were introduced by mixing through the gas introducing pipe 803b.

Also, $F_2$ gas was introduced at 10 sccm through the gas introducing pipe 202b. As the result, a n-type a-Si:H:F:P semiconductor layer 502 was formed to a film thickness of about 500 Å.

Next, in the deposition space 205c, for formation of an i-type a-Si:H:F: semiconductor layer 503 on said n-type a-Si:H:F:P semiconductor layer 502, film formation was conducted continuously as described below by use of $SiH_4$ as the gaseous starting material and $F_2$ gas as the gaseous oxidizing agent.

That is, $SiH_4$ gas was introduced at 40 sccm through the gas introducing pipe 203c, and $F_2$ gas at 20 sccm through the gas introducing pipe 202c. As the result, an i-type a-Si:H:F semiconductor layer 503 was formed to a thickness of about 5000 Å on the n-type a-Si:H:F:P layer already formed in the previous step.

Further, in the deposition space 205d, for formation of a p-type a-Si:C:H:F:B semiconductor layer 504 on said i-type a-Si:H:F semiconductor layer 503, film formation was conducted as described below by use of $SiH_4$ gas and $CH_4$ gas as the gaseous starting materials, $B_2H_6$ gas diluted with He ($B_2H_6/H_2=3000$ ppm) as the starting material for introduction of the p-type impurity and $F_2$ gas as the gaseous oxidizing agent.

First, $SiH_4$ gas at 20 sccm, $CH_4$ gas at 3 sccm and $B_2H_6$ gas diluted to 3000 ppm with He gas at 10 sccm were introduced through the gas introducing pipe 206c into the deposition space. At the same time, $F_2$ gas at 10 sccm was introduced through the gas introducing pipe 202d into the deposition space 206d. As the result, a p-type a-Si:C:H:F:B semiconductor layer having a film thickness of 300 Å was formed.

The semiconductor laminated portion of the optical electromotive device thus obtained was further separated into 2 cm squares in the partial etching step. That is, in the etching space 206e continuous to the deposition space 206d, $F_2$ gas was introduced at 20 sccm through the gas introducing pipe 202e and the jetting portion 207e was moved corresponding to the movement of the substrate 207 to form a groove with the substrate 207 being remained as shown in FIG. 4, whereby separation of the electromotive device was effected.

As shown in FIG. 2, the respective boundary walls of the etching spaces 206a, e and the deposition spaces 206b, c, d were prevented from mixing of impurity gases by introducing inert gases through the gas introducing pipes 204a, b, c, d, respectively. Also, all of the etching chambers and the deposited film forming chambers were evacuated by an evacuation device not shown through the collective evacuation pipe 209.

On each of the photovoltaic devices thus obtained, a transparent electrode ($SnO_2$, 500 Å thickness) 505 was formed by vapor deposition to obtain a pin-type photovoltaic device of SUS/n, a-Si:H:F:P/i, a-Si:H:F/p, a-Si:C:H:F:B/$SnO_2$. And, when a light of AM-1 of 100 mW/cm$^2$ was irradiated, a photovoltaic device with an open voltage of 0.91 V, a short circuit current of 20 mA/cm$^2$ and a conversion efficiency of 9.4% could be obtained more easily than in the prior art.

Figure 9:
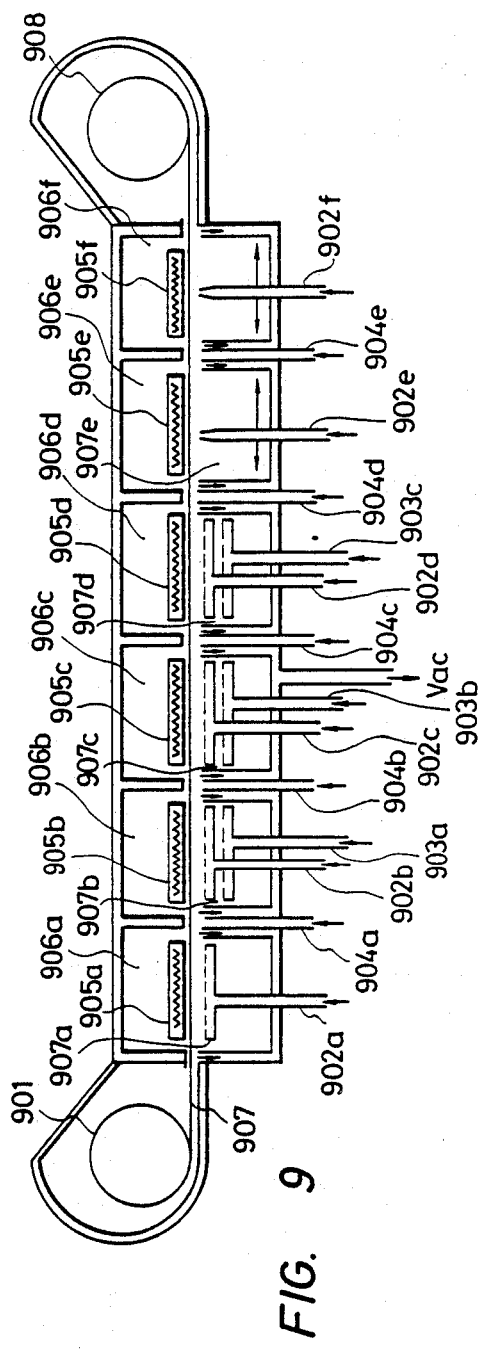
FIG. 9 illustrates schematically the illustration of a second embodiment of the present invention.

FIG. 9 illustrates another example of the device of the present invention, showing the case when the chambers for formation of the respective semiconductor films of the photoelectric converting layer of a pin-type photovoltaic device and the etching chambers are continuously arranged separately.

In the device shown in FIG. 9, the substrate 907 conveyed from the delivery roller 901 is first coarsened on its surface in the etching space 906a, then passes through the respective semiconductor film forming chambers 906b, 906c and 906d in which the respective n, i and p layers are deposited and, is subjected to patterning by passing through the chamber 906e when partial etching treatment is effected and further the chamber 906f where an electroconductive film is partially formed, and taken up by the take-up roller.

Each of the deposition spaces 906b, 906c and 906d has a jetting portion 701 as shown in FIG. 7 and forms each of the n, i and p semiconductor films uniformly over a wide range. In this case, the gaseous halogenic oxidizing agent is introduced through the gas introducing pipe 902b, 902c and 902d, while the gaseous starting material for formation of deposited film through the introducing pipe 903a, 903b and 903c. These correspond to the gas introducing pipes 702 and 703 in FIG. 7. Also, on the back of the substrate 907 opposed to these introducing pipes, there are provided heaters 905b, 905c and 905d for heating of the substrate 907.

Deposition of the respective semiconductor layers of the optical electromotive device in these three deposition spaces 906a, 906c and 906d is effected smoothly by conveying the substrate 907 continuously from the delivery roller to the take-up roller, the respective deposition speeds are controlled by the inner pressures, the gas flow rates, the substrate temperatures so that appropriate film thicknesses may be obtained.

Into the etching spaces 506a e for practicing the etching step, the gaseous halogenic oxidizing agent is introduced through the gas introducing pipes 902a, e, respectively. The gas jetting portions 907a, e of these gas introducing pipes are required to be determined to have their forms depending on the purpose. When the substrate is to be coarsened on the whole surface, a gas jetting portion having jetting orifices 801 radially as shown in FIG. 8 A is preferred, and the intervals 802 of the jetting orifices may be suitably determined.

When etching is partially effected as shown in FIG. 4, for example, etching only of the photoelectric converting layer 401 is effected with the substrate 405 being remained, namely in the case of cutting the photoelectric converting layer, a jetting portion shown in FIG. 8 is used.

It is also possible to move the jetting portion 902 either in parallel or perpendicular to the progress direction of the substrate 907 with the distance from the substrate 907 being maintained constant, whereby a groove along the design can be drawn.

Further, after separation of the photoelectric converting layer in the etching chamber 906e, electroconductive films are laminated partially on the respective photoelectric converting layers and, via the electroconductive film forming chamber 906f for effecting patterning, taken up on the take-up roller 908.

Figure 10:
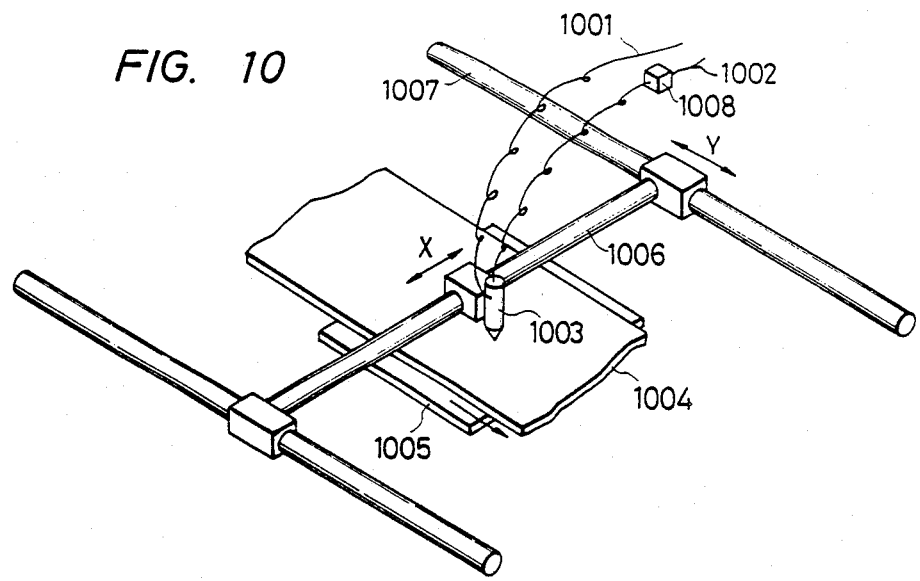
FIG. 10 illustrates schematically a perspective view of an example of the device for performing cell patterning of the photovoltaic device.

FIG. 10 shows a perspective view of the device for effecting patterning of the cell in the etching chamber 906e and the electroconductive film forming chamber 906f as described above.

Through the gas introducing inlets of 1001 and 1002, the gasifiable starting material for formation of deposited film and the gaseous halogenic oxidizing agent were introduced respectively, and released through a gas jetting portion 1003 having a multitubular structure as shown in FIG. 6 to form a deposited film on the substrate 1004. The substrate is heated by the heater 1005. Also, the gas jetting portion 1003 of the multitubular structure can be detected of its position freely by the main scanning rail 1006 and the sub-scanning rail 1007. Also, the starting material fed through the gas introducing pipe 1002 by the electromagnetic valve can be flowed intermittently.

Operation of X,Y and opening-closing of the electromagnetic valve 1008 are controlled by a personal computer and it is possible to form continuously a film subjected to desired patterning. Also, the gas jetting portion 907e in the etching chamber 906e where partial etching is effected is driven according to the method as described above. In this case, the gas jetting portion 907e may have one gas jetting pipe as shown in FIG. 8 B, and only the gas jetting pipe 1002 in FIG. 10 is used.

Next, description is made about an example in which an electromotive device is trially prepared by means of the same device as shown in FIG. 9.

First, a SUS plate shaped in a roll with a thickness of 0.7 mm was used as the substrate 907, and said substrate 907 was extended between a delivery roller 901 and a take-up roller 908. Then, with the main vacuum valve (not shown) being opened, the etching chambers 906a, e and the electroconductive film forming chamber 906f and the semiconductor film forming chambers 906b, c, d were internally thoroughly evacuated. Also, heating was effected to a substrate temperature of 250° C. by the heaters 905a, b, c d, e and f.

As the first step, the substrate 907 was coarsened on its surface by flowing $F_2$ gas through the introducing pipe 902a to effect the texture treatment so that light could be efficiently absorbed by the photoelectric converting device.

$F_2$ gas (diluted to 20% with He) flow rate was 40 sccm and the inner pressure 1.5 Torr.

As the next step, in the semiconductor film forming chamber 906b, on the coarsened surface of the substrate of SUS, for provision of a n-type a-Si:H:F:P semiconductor layer 502, film formation was conducted as described below by use of $SiH_4$ gas as the gaseous starting material, $PH_3$ gas as the starting material for introduction of the n-type impurity and $F_2$ gas as the gaseous oxidizing agent.

That is, $PH_3$ gas diluted to 5000 ppm with He gas (hereinafter called "$PH_3$/He gas") at 10 sccm and $SiH_4$ gas at 20 sccm were introduced by mixing through the gas introducing pipe 903a.

Also, $F_2$ gas was introduced at 10 sccm through the gas introducing pipe 902. As the result, a n-type a-Si:H:F:P semiconductor layer was formed to a film thickness of about 500 Å.

Next, in the deposition space 906c, for formation of an i-type a-Si:H:F semiconductor layer 503 on said n-type a-Si:H:F:P semiconductor layer 502, film formation was conducted continuously as described below by use of $SiH_4$ as the gaseous starting material and $F_2$ gas as the gaseous oxidizing agent. That is, $SiH_4$ gas was introduced at 40 sccm through the gas introducing pipe 903b, and $F_2$ gas at 20 sccm through the gas introducing pipe 902c.

As the result, an i-type a-Si:H:F semiconductor layer was formed to a thickness of about 5000 Å on the n-type a-Si:H:F:P layer already formed in the previous step.

Further, in the deposition space 905d, for formation of a p-type a-Si:C:H:F:B semiconductor layer on said i-type a Si:H:F semiconductor layer, film formation was conducted as described below by use of $SiH_4$ gas and $CH_4$ gas as the gaseous starting materials, $B_2H_6$ gas diluted with He ($B_2H_6/H_2=3000$ ppm) as the starting material for introduction of the p-type impurity and $F_2$ gas as the gaseous oxidizing agent.

First, $SiH_4$ gas at 20 sccm, $CH_4$ gas at 30 sccm and $B_2H_6$ gas diluted to 3000 ppm with He gas at 10 sccm were introduced through the gas introducing pipe 903c into the semiconductor film forming chamber 906d. At the same time, $F_2$ gas at 10 sccm was introduced through the gas introducing pipe 902d into the deposition space 906d.

As the result, a p-type a-Si:C:H:F:B semiconductor layer having a film thickness of 300 Å was formed.

The semiconductor laminated portion of the optical electromotive device thus obtained was further separated into 2 cm squares in the partial etching step. That is, in the etching space 906e continuous to the deposition space 906d, $F_2$ gas was introduced at 20 sccm through the gas introducing pipe 902e and the jetting portion 907e was moved corresponding to the movement of the substrate 907 to form a groove with the substrate 907 being remained as shown in FIG. 4, whereby separation of the photovoltaic device was effected.

As shown in FIG. 9, the respective boundary walls of the etching spaces 906a, e and the deposition spaces 906b, c, d are prevented from mixing of impurity gases by introducing inert gases through the gas introducing pipes 904a, b, c, d, e respectively. Also, all of the etching chambers and the deposited film forming chambers were evacuated by an evacuation device not shown through the collective evacuation pipe 909.

Next, in order to form electrodes on the separated photoelectric converting layers as described above by patterning, a starting gas was introduced through the gas introducing pipe into the electroconductive film forming space 906f.

The jetting portion had a shape as shown in FIG. 6 and a Mo metal film was deposited to a thickness of 1000 Å thereon.

The bomb 607 was heated to 300° C. by the heater 606, and $MoCl_5$ filled in the bomb 607 was gasified and introduced at 20 sccm through the gas introducing pipe 603 into the electroconductive film forming chamber. Similarly, $F_2$ gas filled in the bomb 608 was introduced at 20 sccm and He gas filled in the bomb 608 at 40 sccm through the gas introducing pipe into the electroconductive film forming chamber.

During this operation, the pressure in the electroconductive chamber was made 0.8 Torr. And, partial control of deposition was conducted by peritting the gas to flow intermittently by the electromagnetic valve 610.

Figure 11:
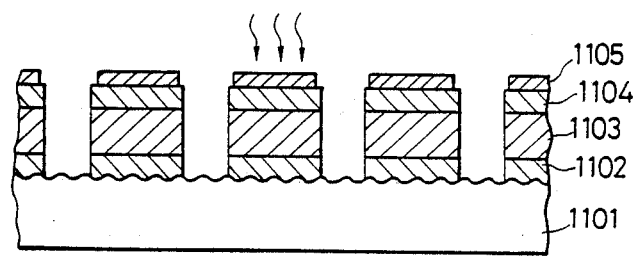
FIG. 11, FIG. 13, FIG. 17 and FIG. 18 each illustrates schematically a sectional view of the photovoltaic device prepared in Examples by the device of the present invention.

A pin-type photovoltaic device having a layer constitution shown in FIG. 11 of SUS/n, a-Si:H:F:P/i, a-Si:H:F/p, a-Si:C:H:F:B/Mo. And, when a light of AM-1 of 100 mW/cm² was irradiated as shown in FIG. 11, a photovoltaic device with an open voltage of 0.95 V, a short circuit current of 20 mA/cm² and a conversion efficiency of 9.7% could be obtained more easily than in the prior art.

In FIG. 11, 1101 is a textured SUS substrate, 1102–1104 are n, i, p type a-Si semiconductor films which are photoelectric converting layers and 1105 is an electrode.

Figure 12:
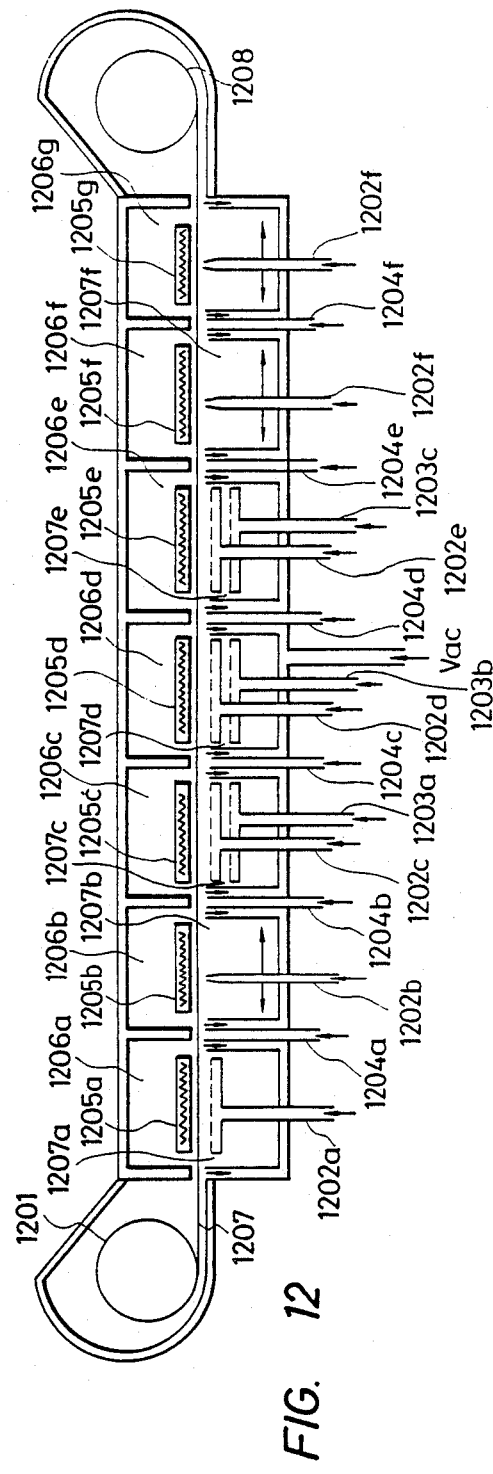
FIG. 12 illustrates schematically a third embodiment of the present invention.

Next, by means of the device as shown in FIG. 12, a photovoltaic device by use of a flexible insulating substrate as the substrate was trially prepared.

The device shown in FIG. 12 is different from that shown in FIG. 9 in the point that an electroconductive forming chamber 1206b for forming partially an electroconductive film on the substrate was connected between the etching chamber 1206a for effecting coarsening of the substrate surface and the n-type semiconductor film forming chamber 1206c.

In this example, Mo metal film with a thickness of 1000 Å was partially deposited and the semiconductor layers were constructed so as to be sandwitched between this film and the electrode of the Mo metal film in the electroconductive film forming chamber 1206 which is the final step.

Figure 13:
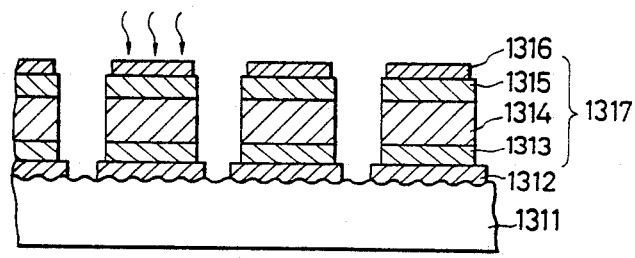

FIG. 13 shows a schematic sectional view of the photovoltaic device.

A 100 μm polyethyleneterephthalate film was used for the substrate 1311, subjected to coarsening of the whole surface in the etching chamber 1206a and then a Mo metal film 1312 was deposited to a thickness of 1000 Å on the substrate under the electroconductive film forming conditions similarly as in the case of preparation by means of the device shown in FIG. 5.

Further, a n-type a-Si:H:F:P semiconductor film 1313, an i-type a-Si:H:F semiconductor film 1314 and a p-type a-SiC:H:F:B semiconductor film were formed respectively in the semiconductor film forming chambers 1206c, 1206d and 1206e to thicknesses of 500 Å, 5000 Å and 500 Å.

Further, the semiconductor films 1312 through 1314 were etched in the etching chamber 1206f to separate them along the electroconductive film 1312 on the side of the substrate 1311 as shown in FIG. 13.

Subsequently, on the photoelectric converting layer 1317 consisting of these separated semiconductor laminated films, an electroconductive film 1316 was partially deposited in the electroconductive film forming chamber 1206g.

The deposition conditions as described above were the same as in the case of the device shown in FIG. 9, but the etching condition of the substrate 1207 and the substrate temperatures by the heaters 1205a–g were set at 150° C., with the flow rate of $F_2$ gas diluted to 20% with He) being set at 30 sccm and the inner pressure at 2.0 Torr.

When a light of AM-1 of 100 mW/cm$^2$ was irradiated on the pin-type a-Si photovoltaic device a-Si photovoltaic device (PET/Mo/n, a-Si:H:F:P/i, a-Si:H:F/p, a-Sic:H:F:B/Mo) from the metal electroconductive 1316 side, an open voltage of 9.96 V, a short circuit current of 22 mA/cm$^2$ and a conversion efficiency of 10.0% were obtained.

In FIG. 12, the respective portions have the following names.

1201, 1208 are rollers, 1202a-g pipes for introducing gaseous oxidizing agents, 1203a-c pipes for introducing gaseous starting materials, 1204a-f gate gas introducing pipes, 1205a-g heaters, 1206a, f etching chambers, 1206b, g chambers for forming electroconductive films, 1207a-f gas jetting portions and 1207 is a substrate.

Figure 14:
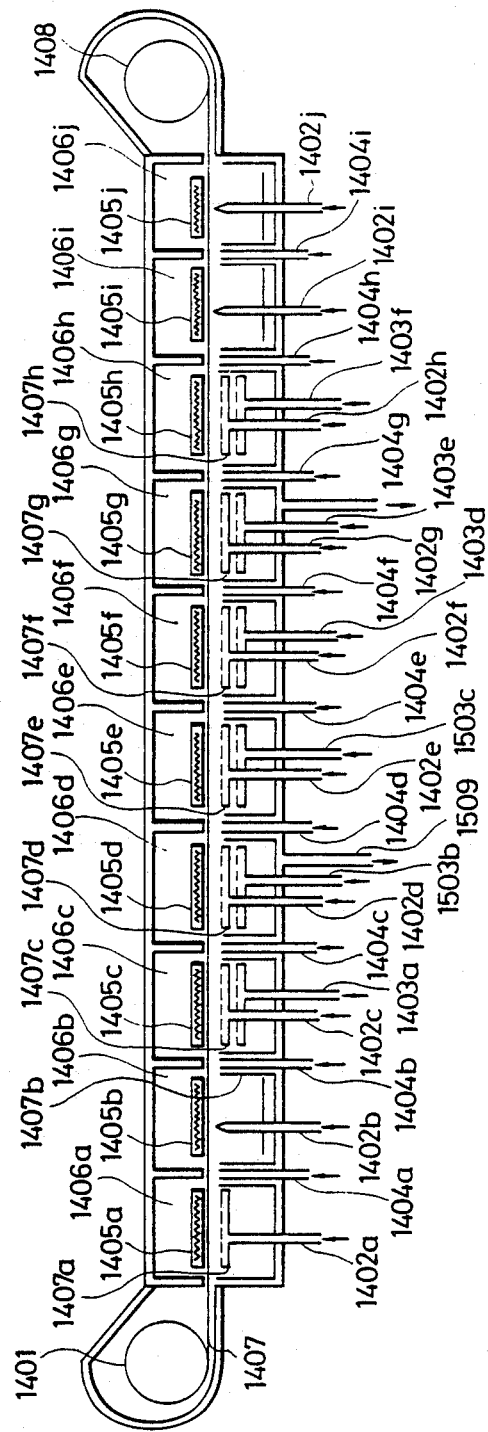
FIG. 14 shows aother embodiment according to the present invention.

FIG. 14 illustrates an example of the device for practicing production of a photovoltaic structure of a tandem structure as an example for forming a multilayer structure according to the device for forming deposited film of the present invention, showing the case of having the chambers for forming the respective semiconductor films of the photoelectric converting layers of a nip/nip type photovoltaic device, etching chambers and chambers for forming electroconductive films arranged continuously while effecting separation of the gases introduced. The respective portions in FIG. 14 have the following names.

1401 is a delivery roller, 142a-j pipes for introducing gaseous oxidizing agent, 1403a-f pipes for introducing gaseous starting materials, 1404a-i gate gas introducing pipes, 1405a-j heaters, 1406a, i etching chambers, 1406a-h semiconductor film forming chambers, 1406j is an electroconductive film forming chamber, 1407a-f are gas jetting portions, and 1408 is a take-up roller.

First, the substrate 1407 of SUS conveyed from the delivery roller 1401 is coarsened on its surface in the etching chamber 1406a, then deposited films of semiconductors controlled in impurities and compound semiconductors are laminated in the semiconductor film forming chambers 1406c-h and the photoelectric converting layers are separated by cutting into appropriate sizes in the etching chamber 1406i, followed further by partial deposition of an electrode in the electroconductive film forming chamber 1406j to complete the device.

The electroconductive film forming chamber 1406b is provided for the purpose of depositing an electrode on the substrate side of the device when the substrate 1407 is an insulating material, and can be used as desired.

The respective deposition spaces 1406c-h have gas jetting portions 701 as shown in FIG. 7 and form uniformly respective semiconductor films of the nip type over a wide range. In this case, the gaseous halogenic oxidizing agent is introduced through the gas introducing pipes 1402c-h and the gaseous starting material for formation of deposited film through the pipes 1403a-f.

These correspond to the gas introducing pipes 702 and 703 in FIG. 7. Also, on the back of the substrate 1407 opposed to these introducing pipes, there exist the respective heaters 1405c-h for heating the substrate 1407. Deposition of the respective semiconductor films of the photovoltaic device in these six deposition spaces 1406c-h can be performed smoothly by conveying the substrate 1407 continuously from the delivery roller 1401 to the take-up roller, and the respective deposition speeds are controlled by the inner pressures, gas flow rates and substrate temperatures so that appropriate film thicknesses may be obtained.

Into the etching chambers for practicing the etching steps, gaseous halogenic substances are introduced respectively through the gas introducing pipes 502a, i. The gas jetting portions of these gas introducing pipes are required to have forms determined depending on the purpose When the substrate 1707 is coarsened on the whole surface, it is preferable to use the gas jetting portions having jetting orifices 301 provided radially as shown in FIG. 3 A, and the intervals between the jetting orifices 301 can be determined suitably as desired On the other hand, when partial etching is practiced as shown in FIG. 15, for example, etching only of the photoconductive layer 1501 is effected with the substrate 1502 being remained, namely in the case of cutting of the photoelectric converting layer, a jetting portion shown in FIG. 3 B is used.

Figure 15:
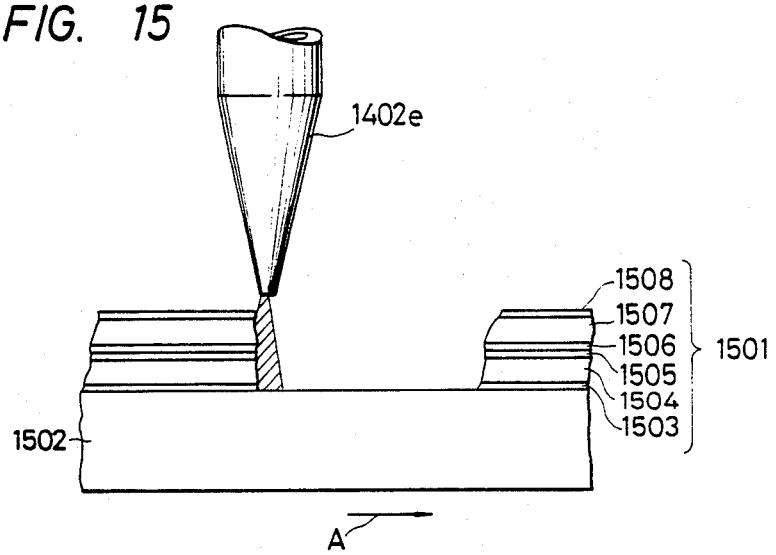

FIG. 15 shows schematically partial etching and, in the etching chamber 1406i in FIG. 14, etching of the respective semiconductor layers 1503–1508 deposited in the semiconductor film forming chambers 1406c-h are effected.

The jetting orifice 1402i can be moved both in parallel or vertically to the progress direction of the substrate 1507 with the distance from the substrate 1407 being maintained constant, and a groove along the design can be drawn.

Further, after separation of the photoelectric converting layer in the etching chamber 1406i, electroconductive films are laminated on the respective photoelectric converting layers partially for patterning in the electroconductive forming chamber 1406j, followed by take-up on the take-up roller.

The device for carrying out patterning the cell in the etching chamber 1406i and the electroconductive film forming chamber 1406j is shown in FIG. 10.

The semiconductor device provided by the device for forming deposited film shown in FIG. 14 may be, for example, a photovoltaic device of a tandem structure as shown typically by FIG. 16 A through C.

That is, the example shown in FIG. 16 A is a photovoltaic device of a double layer structure on which photoirradiation is effected from the electroconductive layer 1608 side, which is applicable for a solar battery.

In FIG. 16 A, 1601 represents a substrate, 1602 and 1605 semiconductor layers (p-type or n-type), 1603 and 1606 i-type semiconductor layers, 1604 and 1607 semiconductor layers (n-type or p-type) and 1605 an electroconductive layer, respectively.

Figure 16A:
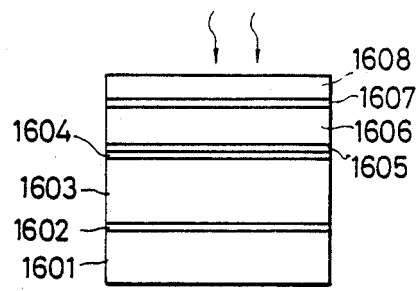

The example shown in FIG. 16 B has substantially the same constitution as that shown in FIG. 16A, but it is a photovoltaic device having an electroconductive layer provided on the substrate, which is also applicable for a solar battery.

Figure 16B:
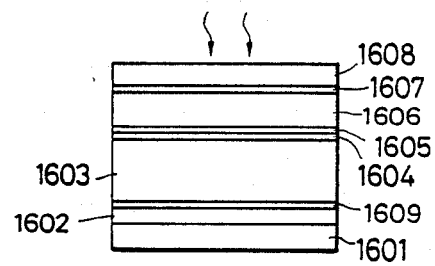
Figure 16C:
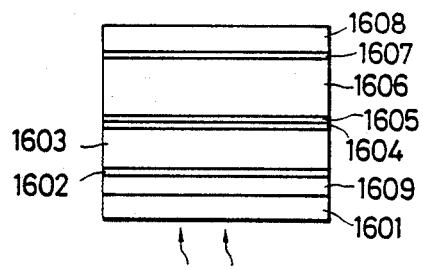

The example shown in FIG. 16C is also similar to that shown in FIG. 16B, but it is a photovoltaic device of the type on which photoirradiation is effected from the substrate side.

Also in FIG. 16B and C, 1601 represents a substrate, 1602 and 1605 semiconductor layers (p-type or n-type), 1603 and 1606 i-type semiconductor layers, 1603 and 1606 electroconductive layers, 1604 and 1607 semiconductor layers (n-type or p-type) and 1608 and 1609 electroconductive layers, respectively.

For every type of the devices shown in FIG. 16A through C, the same substrate, the semiconductor layer and the photoconductive layer as explained for the photovoltaic device in FIG. 5A–D can be employed.

Next, description is made about an example in which an electromotive device is trially prepared by means of the same device as shown in FIG. 14.

First, a SUS plate shaped in a roll with a thickness of 0.7 mm was used as the substrate 1407, and said substrate 1407 was extended between a delivery roller 1401 and a take-up roller 1408. Then, with the main vacuum valve (not shown) being opened, the etching chambers 1406a, i, the electroconductive film forming chamber 1406j and the semiconductor film forming chambers 1406b–h were internally thoroughly evacuated. Also, heating was effected to a substrate temperature of 250° C. by the heaters 1405a–j.

As the first step, the substate 1407 was coarsened on its surface by flowing $F_2$ gas through the introducing pipe 1402 to effect the texture treatment so that light could be efficiently absorbed by the photoelectric converting device.

$F_2$ gas (diluted to 20% with He) flow rate was 40 sccm and the inner pressure 1.5 Torr.

As the next step, in the semiconductor film forming chamber 1406b, on the coarsened surface of the substrate of SUS, for provision of a n-type a-Si:H:F:P semiconductor layer 502, film formation was conducted as described below by use of $SiH_4$ gas as the gaseous starting material, $PH_3$ gas as the starting material for introduction of the n-type impurity and $F_2$ gas as the gaseous oxidizing agent.

That is, $PH_3$ gas diluted to 5000 ppm with He gas (hereinafter called "$PH_3$/He gas") at 10 sccm and $SiH_4$ gas at 10 sccm were introduced by mixing through the gas introducing pipe 1403a.

Also, $F_2$ gas was introduced at 5 sccm through the gas introducing pipe 1402c. As the result, a n-type a-Si:H:F:P semiconductor layer was formed to film thickness of about 200 Å.

Next, in the semiconductor film forming chamber 1406d, for formation of an i-type a-Si:H:F semiconductor layer on said n-type a-Si:H:F:P semiconductor layer, film formation was conducted continuously as described below by use of $SiH_4$ and $GeH_4$ as the gaseous starting material and $F_2$ gas as the gaseous oxidizing agent.

That is, $SiH_4$ gas was introduced at 30 sccm and $GeH_4$ gas at 20 sccm through the gas introducing pipe 1403b, and $F_2$ gas at 20 sccm through the gas introducing pipe 1402d. As the result, an i-type a-Si:H:F semiconductor layer was formed to a thickness of about 5000 Å on the n-type a-Si:H:F:P layer already formed in the previous step.

Further, in the deposition space 1405e, for formation of a p-type a-Si:C:H:F:B semiconductor layer 504 on said i-type a-Si:H:F semiconductor layer 503, film formation was conducted as described below by use of $SiH_4$ gas and $CH_4$ gas as the gaseous starting materials, $B_2H_6$ gas diluted with ($B_2H_6/H_2 = 3000$ ppm) as the starting material for introduction of the p-type impurity and $F_2$ gas as the gaseous oxidizing agent.

First, $SiH_4$ gas at 10 sccm, $CH_4$ gas at 2 sccm and $B_2H_6$ gas diluted to 3000 ppm with He gas at 5 sccm were introduced through the gas introducing pipe 1403c into the semiconductor film forming chamber 1406e. At the same time, $F_2$ gas at 10 sccm was introduced through the gas introducing pipe 1402e into the deposition space 1406e.

As the result, a p-type a-Si:C:H:F:B semiconductor layer having a film thickness of 150 Å as formed.

On the photoelectric converting device of a single layer thus obtained, one more layer was further connected to obtain a tandem type photovoltaic device of a double layer structure.

That is, further in the semiconductor film forming chamber 1406f, on said p-type a-Si:C:H:F:B semiconductor layer, a n-type a-SiC:H:F:P semiconductor layer was formed in the same manner as in formation of the first n-type semiconductor layer.

The conditions employed were such that $SiH_4$ gas at 8 sccm and $PH_3$ diluted to 5000 ppm with He gas at 10 sccm were mixed and introduced through the gas introducing pipe 1403d.

Also, $F_2$ gas was introduced at 5 sccm through the gas introducing pipe 1402c. As the result, a n-type a-Si:H:F:P semiconductor layer was laminated to a film thickness of about 100 Å.

Further, the second i-type semiconductor layer was formed of an i-type a-Si:H:F semiconductor layer more thinly as different from the a-SiGe:H:F layer of the first layer. This is because spectral light absorption on the higher energy side is to be effected in the second layer, while spectral light absorption on the lower energy side sufficiently in the previous first layer.

Formation of the second i-type a-Si:H:F semiconductor layer was conducted in the semiconductor film forming chamber 1406f under the conditions as described below.

That is, $SiH_4$ gas was introduced at 30 sccm through the gas introducing pipe 1403g and $F_2$ gas at 20 sccm through the gas introducing pipe 1402g. As the result, an i-type a-SiH:F semiconductor film was formed to a thickness of about 3000 Å on the p-type a-Si:H:F:B already formed in the previous step.

Finally, on the second i-type a-Si:H:F semiconductor, a p-type a-Si:H:F:B semiconductor film was laminated to give a double layer tandem structure photovoltaic device having a second photoelectric converting structure unit formed on the first photoelectric converting structure as described above.

The conditions for the p-layer were such that $SiH_4$ gas at 10 sccm, $CH_4$ gas at 2 sccm and $B_2H_6$ gas diluted to 3000 ppm with He gas at 5 sccm were introduced into the semiconductor film forming chamber 1406h through the gas introducing pipe 1403f.

At the same time, $F_2$ gas was introduced at 3 sccm through the gas introducing pipe 1402h into the semiconductor film forming chamber 1406h. As the result, a p-type a-SiC:H:F:B having a film thickness of 150 Å was formed.

The semiconductor laminated portion of the optical electromotive device thus obtained was further separated into 2 cm squares in the partial etching step. That is, in the etching chamber 1406i continuous to the semiconductor film forming chamber 1406h, $F_2$ gas was introduced at 20 sccm through the gas introducing pipe 1402i and the jetting portion 1407i was moved corresponding to the movement of the substrate 1407 to form a groove with the substrate 1407 being remained as shown in FIG. 4, whereby separation of the electromotive device was effected.

As shown in FIG. 14, the respective boundary walls of the etching chambers 1406 a, i, the electroconductive film forming chamber 1406j and the semiconductor film forming chambers 1406c–h were prevented from mixing of impurity gases by introducing inert gases through the gas introducing pipes 1404a-i, respectively. Evacuation is conducted through the gas evacuation pipe 1409.

Next, in order to form electrodes on the separated photoelectric converting layer as described above by patterning, a starting gas was introduced through the gas introducing pipe 1402j into the electroconductive film forming space 1406j. The jetting portion had a shape as shown in FIG. 6 and a Mo metal film was deposited to a thickness of 1000 Å thereon.

The bomb 607 was heated to 300° C. by the heater 606, and MoCl$_5$ filled in the bomb 607 was gasified and introduced at 20 sccm through the gas introducing pipe 603 into the electroconductive film forming chamber. Similarly, F$_2$ gas filled in the bomb 608 was introduced at 20 sccm and He gas filled in the bomb 608 at 40 sccm through the gas introducing pipe into the electroconductive film forming chamber.

During this operation, the pressure in the electroconductive chamber was made 0.8 Torr. And, partial control of deposition was conducted by peritting the gas to flow intermittently by the electromagnetic valve 610.

Figure 17:
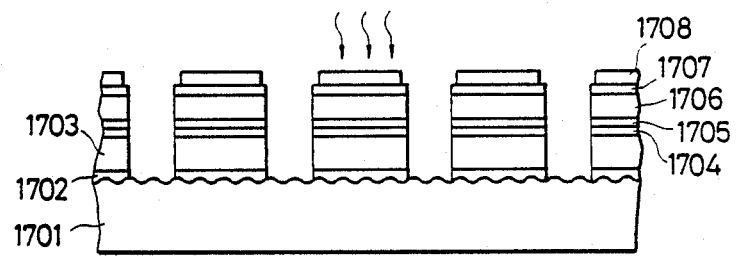

A tandem type photovoltaic device having a layer constitution shown in FIG. 17 of SUS/n, a-Si:H:F:P/i, a-SiGe:H:F/p, a-Si:C:H:F:B/n, a-Si:H:F:P/i, a-Si:H:F/p, a-SiC:HF:B was obtained. And, when a light of AM-1 of 100 mW/cm$_2$ was irradiated as shown in FIG. 17, a photovoltaic device with an open voltage of 0.97 V, a short circuit current of 22 mA/cm$^2$ and a conversion efficiency of 10.2% could be obtained more easily than in the prior art.

Next, by means of the device as shown in FIG. 14, a photovoltaic device by use of a flexible insulating substrate as the substrate was trially prepared.

In this example, Mo metal film with a thickness of 1000 Å was partially deposited and the semiconductor layers were constructed so as to be sandwitched between this film and the electrode of the Mo metal film in the electroconductive film forming chamber 1406g which is the final step.

Figure 18:
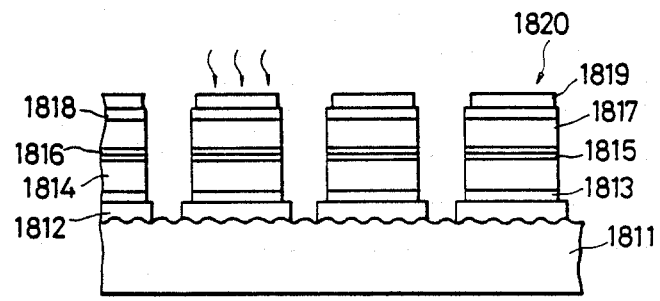

FIG. 18 shows a schematic sectional view of the photovoltaic device. A 100 μm polyethyleneterephthalate film was used for the substrate 1811, subjected to coarsening of the whole surface in the etching chamber 1406a and then a Mo metal film 1812 was deposited to a thickness of 1000 Å on the substrate under the electroconductive film forming conditions similarly as in the previous example.

Further, a n-type a-Si:H:F:P semiconductor film 1813, an i-type a-Si:H:F semiconductor film 1814 and a p-type a-SiC:H:F:B semiconductor film were formed respectively in the semiconductor film forming chambers 1406c, 1406d and 1406e to thicknesses of 200 Å, 5000 Å and 150 Å. Further, similarly, the n, i and p layers 1816-1818 in the second layer were formed respectively to 100 Å, 3000 Å and 150 Å in the semiconductor forming chambers 1406f-h. Further, the semiconductor films 1813 through 1818 were etched in the etching chamber 1406i to separate them along the electroconductive film 1812 on the substrate 1811 as shown in FIG. 18.

Subsequently, on the tandem structure photoelectric converting layer 1820 consisting of these separated semiconductor laminated films, an electroconductive film 1819 was partially deposited in the electroconductive film forming chamber 1406j.

The deposition conditions as described above were the same as in the previous example, but the etching condition of the substrate 1407 and the substrate temperatures by the eaters 1405a-j were set at 150° C., with the flow rate of F$_2$ gas (diluted to 20% with He) as the etching gas being set at 30 sccm and the inner pressure at 2.0 Torr.

When a light of AM-1 of 100 mW/cm$^2$ was irradiated on the tandem type a-Si photovoltaic device a-Si photovoltaic device (PET/Mo/n, a-Si:H:F:P/i, a-SiC:H:F/p, a-SiC:H:F:B/n, a-Si:H:F:P/n-a-Si:H:FP/i, a-Si:H:F/p, a-SiC:H:F:B) as shown in FIG. 18 thus obtained from the PET substrate 1811 side, an open voltage of 0.97 V, a short circuit current of 21 mA/cm$^2$ and a conversion efficiency of 10.1% were obtained.

The photovoltaic device of tandem structure prepared by the device of the present invention is not limited to double layer structure devices but the present invention is also applicable similarly for devices having three or more layer structures.

We claim:

1. An apparatus for forming a deposited film on a substrate by a chemical reaction between a gaseous starting material for formation of the deposited film and a gaseous oxidizing agent having the property of oxidation action on said gaseous starting material, comprising:
    at least one deposition chamber in which said deposited film is formed, said chamber including a gaseous releasing means having a first orifice for introducing said gaseous starting material and a second orifice for introducing said gaseous oxidizing agent, said first and second orifices positioned adjacent one another so as to create a reaction mixture between said gaseous starting material and gaseous oxidizing agent; and
    at least one etching chamber in which the etching of said substrate or the deposited film formed thereon occurs, said etching chamber including a gas orifice with a narrowed tip to dispense etchant gas.

2. An apparatus for forming deposited film according to claim 1, wherein at least one of the etching chambers has a gas jetting portion provided with a large number of gas jetting orifices for surface coarsening the substrate and/or the deposited film.

3. An apparatus for forming deposited film according to claim 1, having three chambers for formation of deposited film connected to one another.

4. An apparatus for forming deposited film according to claim 3, wherein the three chambers for formation of deposited film consist of a p-type semiconductor layer deposition chamber, an i-type semiconductor layer deposition chamber and n-type semiconductor layer deposition chamber.

5. An apparatus for forming deposited film according to claim 3, wherein the three chambers for formation of deposited film consist of a p-type semiconductor layer deposition chamber, an i-type semiconductor layer deposition chamber and an insulating layer deposition chamber.

6. An apparatus for forming deposited film according to claim 1, wherein etching in the etching chamber is effected chemically with a gaseous halogenic oxidizing agent.

7. An apparatus for forming a deposited film on a substrate by a chemical reaction between a gaseous starting material for formation of the deposited film and a gaseous oxidizing agent having the property of oxidation action on said gaseous starting material, comprising:

at least one deposition chamber in which said deposited film is formed, said chamber including a gas releasing means having a first orifice with a narrowed tip for introducing said gaseous starting material and a second orifice with a narrowed tip for introducing said gaseous oxidizing agent, said first and second orifices positioned adjacent one another so as to create a reaction mixture between said gaseous starting material and said gaseous oxidizing agent;

at least one etching chamber in which the etching of said substrate or the deposited film formed thereon occurs; and at least one electroconductive film forming chamber for forming an electroconductive film on the surface of said substrate or the deposited film formed on the substrate.

8. An apparatus for forming deposited film according to claim 7, having a gas jetting portion provided with a large number of gas jetting orifices.

9. An apparatus for forming deposited film according to claim 7, having three chambers for formation of deposited film connected to one another.

10. An apparatus for forming deposited film according to claim 7, wherein the three chambers for formation of deposited film consist of a p-type semiconductor layer deposition chamber, an i-type semiconductor layer deposition chamber and a n-type semiconductor layer deposition chamber.

11. An apparatus for forming deposited film according to claim 7, wherein the three chambers for formation of deposited film consist of a p-type semiconductor layer deposition chamber, an i-type semiconductor layer deposition chamber and an insulating layer deposition chamber.

12. An apparatus for forming deposited film according to claim 7, wherein etching in the etching chamber is effected chemically with a gaseous halogenic oxidizing agent.

13. An apparatus for forming deposited film according to claim 7, wherein at least one of the etching chambers has a gas jetting portion provided with a large number of gas jetting orifices for surface coarsening of the substrate and/or the deposited film.

14. An apparatus for forming deposited film according to claim 7, wherein at least one of the etching chambers has as gas jetting portion provided with a narrowed gas jetting orifice for severing the deposited film.

15. An apparatus for forming deposited film according to claim 7, wherein the electroconductive film forming chamber has a gas jetting portion provided with a large number of gas jetting orifices.

16. An apparatus for forming deposited film according to claim 7, wherein the electroconductive film forming chamber has a gas jetting portion provided with a narrowed gas jetting orifice.

17. An apparatus for forming a deposited film on a substrate by a chemical reaction between a gaseous starting material for formation of the deposited film and a gaseous oxidizing agent having the property of oxidation action on said gaseous starting material, comprising:

at least one deposition chamber win which said deposited film is formed, said chamber including a gas introducing means having a first orifice for releasing said gaseous starting material and a second orifice for introducing said gaseous oxidizing agent, said first and second orifices positioned adjacent one another so as to create a reaction mixture between said gaseous starting material and gaseous oxidizing agent;

at least one etching chamber in which the etching of said substrate or the deposited film thereon occurs; and at least one electroconductive film forming chamber for forming an electroconductive film on the surface of said substrate or the deposited film formed on the substrate; and said chambers arranged in sequence for the formation of a single structural device.

* * * * *